US009453886B2

(12) United States Patent
Makino et al.

(10) Patent No.: US 9,453,886 B2
(45) Date of Patent: Sep. 27, 2016

(54) SWITCH CIRCUIT, SELECTION CIRCUIT, AND VOLTAGE MEASUREMENT DEVICE

(75) Inventors: Ryosei Makino, Kanagawa (JP); Hirohiko Hayakawa, Hyogo (JP)

(73) Assignee: Renesas Electronics Corporation, Kanagawa (JP)

( * ) Notice: Subject to any disclaimer, the term of this patent is extended or adjusted under 35 U.S.C. 154(b) by 375 days.

(21) Appl. No.: 14/112,893

(22) PCT Filed: Apr. 10, 2012

(86) PCT No.: PCT/JP2012/059756
§ 371 (c)(1),
(2), (4) Date: Oct. 18, 2013

(87) PCT Pub. No.: WO2012/144373
PCT Pub. Date: Oct. 26, 2012

(65) Prior Publication Data
US 2014/0043032 A1 Feb. 13, 2014

(30) Foreign Application Priority Data
Apr. 21, 2011 (JP) .................. 2011-094801

(51) Int. Cl.
*G01R 31/36* (2006.01)
*H03K 17/687* (2006.01)
(Continued)

(52) U.S. Cl.
CPC ............ *G01R 31/362* (2013.01); *H03K 17/04* (2013.01); *H03K 17/6871* (2013.01); *H03K 17/693* (2013.01); *G01R 31/3658* (2013.01)

(58) Field of Classification Search
CPC .................................. G01R 31/362
USPC ....................................... 324/434
See application file for complete search history.

(56) References Cited

U.S. PATENT DOCUMENTS 5,410,192 A * 4/1995 Yamada ............... H03K 17/693
326/106
5,541,553 A 7/1996 Chujo et al.
(Continued)

FOREIGN PATENT DOCUMENTS

JP 06-301882 A 10/1994
JP 2002-009600 A 1/2002
(Continued)

OTHER PUBLICATIONS

International Search Report for International Application No. PCT/JP2012/059756 dated Jun. 26, 2012, with English translation, 2 pages.
(Continued)

*Primary Examiner* — Drew A Dunn
*Assistant Examiner* — Jerry D Robbins
(74) *Attorney, Agent, or Firm* — McDermott Will & Emery LLP

(57) ABSTRACT

Provided is a technique that contributes to the improvement of voltage measurement accuracy and uniform current consumption of a battery in a voltage measurement device. Switch circuits (SWP and SWN) include switch elements (MP1 and MP2 or MN1 and MN2) which are provided between an input terminal and an output terminal, and switch driving units (401 to 409) which are driven between a first power supply voltage (VCC or GND) and a second power supply voltage (GND or VCC), which are different from each other, with an input voltage interposed therebetween. The switch driving unit includes source follower circuits (401 and 404) having a drain side being connected to a first power supply terminal side that is supplied with the first power supply voltage, inputting a voltage based on the input voltage, and supplying a voltage generated in the output side to the switch element as a driving voltage for driving the switch element; and current control units (402 and 405) which open and close a current path between the output side of the source follower circuit and a second power supply terminal being supplied with the second power supply voltage, in response to a control signal (ENABLE).

30 Claims, 15 Drawing Sheets

(51) Int. Cl.
*H03K 17/04* (2006.01)
*H03K 17/693* (2006.01)

(56) References Cited

U.S. PATENT DOCUMENTS

| | | | |
|---|---|---|---|
| 6,362,627 B1* | 3/2002 | Shimamoto | G01R 19/25 324/434 |
| 2005/0206386 A1* | 9/2005 | Ishikawa | G01R 19/2503 324/416 |
| 2005/0218900 A1 | 10/2005 | Iwabuchi et al. | |
| 2006/0012336 A1* | 1/2006 | Fujita | H02J 7/0021 320/119 |
| 2006/0087329 A1* | 4/2006 | Iwabuchi | G01R 19/16542 324/713 |
| 2006/0186894 A1 | 8/2006 | Iwabuchi et al. | |
| 2006/0255768 A1 | 11/2006 | Yoshio | |
| 2009/0058505 A1 | 3/2009 | Yoshio | |
| 2010/0052656 A1* | 3/2010 | Tanaka | G01R 31/3658 324/123 R |
| 2010/0073207 A1* | 3/2010 | Gupta | H03M 3/388 341/120 |

FOREIGN PATENT DOCUMENTS

| | | |
|---|---|---|
| JP | 2004-072749 A | 3/2004 |
| JP | 2005-003394 A | 1/2005 |
| JP | 2005-017289 A | 1/2005 |
| JP | 2005-091136 A | 4/2005 |
| JP | 2005-265776 A | 9/2005 |
| JP | 2005-283258 A | 10/2005 |
| JP | 2006-053120 A | 2/2006 |
| JP | 2006-105824 A | 4/2006 |
| JP | 2006-320183 A | 11/2006 |
| JP | 2008-099371 A | 4/2008 |
| JP | 2009-301209 A | 12/2009 |
| JP | 2010-060435 A | 3/2010 |
| WO | 2004/086065 A1 | 10/2004 |

OTHER PUBLICATIONS

Extended European Search Report issued in EP 12773728.6 dated Nov. 17, 2014, 7 pages.
Chinese Office Action dated Jan. 22, 2015 issued in corresponding Chinese Patent Application No. 201280019197.2 (English translation).
Japanese Office Action issued in Japanese Application No. 2013-510954 dated Jul. 17, 2014, w/English translation.
Chinese Office Action issued in Application No. 201280019197.2 dated Oct. 16, 2015, with English translation.

* cited by examiner

SWITCH CIRCUIT, SELECTION CIRCUIT, AND VOLTAGE MEASUREMENT DEVICE

TECHNICAL FIELD

The present invention relates to a switch circuit, a selection circuit, and a voltage measurement device, and more particularly, to an effective technique that is applied to a voltage measurement device that selects one voltage among a plurality of voltages to measure the selected voltage.

BACKGROUND ART

At present, electric vehicles (EVs) and hybrid electric vehicles (HEVs), which use motors as driving sources for vehicle running, have been developed in many companies and organizations, without regard to automobile manufacturers. An in-car power supply having a high voltage of several hundreds of volts is required to drive these motors. The in-car power supply is realized by an assembled battery in which a plurality of unit cells (also referred to as "battery cells") generating a voltage of approximately several volts are connected to each other in series.

In electric vehicles and the like, a voltage of each battery cell VCL is required to be measured with a high level of accuracy in order to determine a state (for example, an overcharge state, an overdischarge state, or a remaining amount of charge) of the battery, under all usage environments at the time of running or charging of the vehicle, and the like. A technique of detecting a battery voltage with a high level of accuracy is essential for effective utilization of battery energy, and particularly, is an important technique that is related to the stability of a vehicle and a long vehicle running distance, as a vehicular power supply.

In order to respond to such a high level of accuracy and to realize a further reduction in cost, in a voltage measurement device of an in-car power supply, a configuration is mainly put into practice in which one AD converter (hereinafter, also referred to as an analog-to-digital converter (ADC)) is not included in one battery cell VCL, but one ADC is included in one block by setting several to several tens of battery cells to one block. In addition, in order to realize the configuration, the voltage measurement device realizes the measurement of a voltage by mounting a multiplexer circuit (hereinafter, also referred to as a MUX (multiplexer)), and temporally sequentially switching by the MUX battery voltages having a plurality of different voltage levels to a signal input of the ADC which is designed on the basis of the lowest level of potential (a ground (GND) level). In addition, as a type of a circuit for measuring the battery voltages, a type of the related art using a flying capacitor circuit is most commonly used (for example, refer to PTL 1). This type is configured by using at least one capacitor as a part of a MUX circuit. In this capacitor, neither terminal of both poles thereof is fixed to a specific potential during a normal time. The capacitor is configured to be connected to input voltage terminals of both poles of each battery through a switch circuit on the battery side, and to be connected to two input terminals of an ADC through a switch circuit on the ADC side. In addition, any one terminal of the capacitor is configured to be connected to a GND potential or a predetermined fixed potential through another switch circuit. A brief description will be given below of an operation of a flying capacitor circuit at the time of measurement which is disclosed in PTL 1. For example, first, a switch on the battery side which connects both ends of a battery of which a voltage is measured and a capacitor C is turned on so as to charge a battery voltage in the capacitor C. Next, the switch on the battery side is turned off, and then any one electrode of the capacitor C is connected to the GND potential or the fixed potential. Thus, it is possible to shift battery voltages at different voltage levels to a voltage region within an operation range of the ADC. Then, in this state, a switch on the ADC side is turned on so as to be electrically connected to the ADC, and the voltage value thereof is read through the ADC. Meanwhile, a buffer amplifier or a differential amplifier is sometimes used between the capacitor C and the ADC, but an operation procedure is the same as above.

The prior art of a voltage measurement device is disclosed in PTLs 1 to 9, and other related art is disclosed in PTLs 10 to 12.

PTL 1 discloses, as a method of uniformizing a driving current of a switch which is consumed from a battery in case that a switch element for connecting a battery voltage input and a capacitor is turned on in each switch circuit of a flying capacitor type voltage measurement device, a technique of performing weighting on the driving current in each battery so as to increase the consumption of a current flowing to a level shift circuit for driving a switch connected to a unit battery cell as the level shift circuit has a higher level.

PTL 2 discloses a method of connecting a voltage detection circuit and a capacitor by using N+1 switching elements having a PNP structure or an NPN structure, with respect to N battery cells.

PTLs 3 to 6 disclose a configuration in which the same number of capacitors as voltage sources to be measured are used and only one N-type or P-type MOSFET is used as a switch element of each switch circuit. In addition, PTL 5 discloses a method of measuring in advance a stray capacitance including a parasitic capacitance of a switch group, calculating an error voltage due to charge accumulated in the stray capacitance on the basis of a capacitance of a flying capacitor, the measured stray capacitance, and the like and calculating a measured voltage on the basis of the error voltage, in order to improve a measurement error due to a parasitic capacitance of a switch that is used in the flying capacitor. Furthermore, PTL 6 discloses a method of improving an error due to a parasitic capacitance component of a switch.

PTL 7 discloses a method of using as many capacitors as battery cells in a voltage measuring circuit and using an MOSFET as a switch element of each switch circuit, in order to respond to charge missing due to a parasitic diode between a source and a drain of a MOS transistor that is used as the switch element.

PTL 8 discloses a method of turning on a switch by an alternating-current signal, by using a capacitor in a level shift circuit for a signal for turning on a switch that connects a battery voltage input and a capacitor.

PTL 9 discloses a method of using a sample hold circuit in which a switch and a differential amplifier circuit (OP amplifier) are combined, in order to improve a measurement error due to a parasitic capacitance of the switch, similar to PTL 5.

PTL 10 discloses a method of controlling opening and closing of a power feeding path between an external electrode and a battery in order to stably charge the battery in a battery protection circuit.

PTL 11 discloses a method of connecting a cascode transistor in a system having an insufficient withstand voltage in one MOS transistor.

PTL 12 discloses a technique for preventing a reverse flow of a current from a battery due to overcharge of the battery or a reduction in an input voltage in controlling battery charging.

CITATION LIST

Patent Literature

[PTL 1] JP-A-2005-265776
[PTL 2] JP-A-2006-53120
[PTL 3] Pamphlet of International Publication No. WO2004/086065
[PTL 4] JP-A-2005-283258
[PTL 5] JP-A-2006-105824
[PTL 6] JP-A-2005-3394
[PTL 7] JP-A-2005-91136
[PTL 8] JP-A-2005-17289
[PTL 9] JP-A-2008-99371
[PTL 10] JP-A-2006-320183
[PTL 11] JP-A-2002-9600
[PTL 12] JP-A-2009-301209

DISCLOSURE OF THE INVENTION

Problems that the Invention is to Solve

The inventor of the present application has found the following new problems, as a result of examining technical problems thereof, in accordance with demands for a high level of voltage measurement accuracy and uniform current consumption of a battery in a voltage measurement device.

A first problem is a decrease in battery durability due to unbalanced energy consumption of a battery to be measured. Although not a well-known technique, FIG. 19 is an example of a switch circuit in which a P-type MOS transistor, which was examined by the inventor of the present application before the present invention, is used as a switch element. In addition, similarly to FIG. 19, FIG. 20 is an example of a switch circuit in which an N-type MOS transistor, which was examined by the inventor of the present application before the present invention, is used as a switch element.

The switch circuits illustrated in FIG. 19 and FIG. 20 include a switch driving unit that includes a bidirectional switch for connecting sources of two MOS transistors in common with each other and connecting gates thereof in common with each other, a MOS transistor that is controlled by a control signal (ENABLE) for controlling the switch, a MOS transistor for generating a constant current, and a resistor R. For example, a case is considered where the switch circuit of FIG. 19 or FIG. 20 is used as a switch circuit in a MUX circuit of a voltage measurement device. When voltages of battery cells constituting an assembled battery are measured by the voltage measurement device, a switch is turned on by a switch driving circuit so as to connect an input terminal (VIN) being connected to the battery cell to be measured, to an output terminal (VOUT) being connected to the measurement circuit side. At this time, in the switch driving circuit, a driving current I for turning on the switch flows to a ground (GND) through the resistor R from the input side (VIN). In this manner, in order to facilitate the use of a low withstand voltage element of the switch driving circuit and the controlling through a signal, when a switch element is driven by causing the driving current I to flow to a GND level from an electrode of the battery cell to be measured, since the battery cells are connected to each other in series, the battery cell disposed at a lower level is more likely to frequently extract the driving current. On the contrary, the driving current is not likely to be extracted from the battery cell that is disposed at the highest level, which may result in unbalanced energy consumption of a battery. As a method of resolving this problem, a method of weighting the driving current of the switch driving circuit is disclosed in PTL 1, as described above. However, in this method, when the number of battery cells that are connected to each other in series is increased, the driving current increases in accordance with the number of battery cells, and thus a unit current of the driving current is required to be considerably decreased in order to suppress the power consumption of the battery. In addition, a switch element in the vicinity of the lowermost level has to generate an on-voltage using a microcurrent, and a resistive element (for example, a resistive element corresponding to the resistors R of FIG. 19 and FIG. 20) for generating the on-voltage of the driving circuit has a high resistance, which results in an increase in an area of the voltage measurement device.

A second problem is deterioration in voltage measurement accuracy due to a voltage drop occurring due to resistance components of a switch element and a signal path and a driving current of the switch element. As described in the first problem, when the driving current for turning on the switch element is supplied from a battery cell to be measured, a voltage drop occurs due to the driving current flowing to an on-resistance of the switch element, a resistance component of a signal path through which the driving current flows, and a resistance component of an external noise cut filter between an electrode of the battery cell and the switch element. These resistance components cannot be uniformly manufactured in all products, and thus a variation necessarily occurs in the element. However, the variation in resistance component causes a difference between the voltage drops. The difference between the voltage drops becomes a factor deteriorating the voltage measurement accuracy. For example, in PTL 2, a PMOS transistor is used for a switch on the positive electrode side, as a switch element corresponding to each battery cell, and an NMOS switch is used on the negative electrode side. However, when there is a considerable variation in resistance component in the switch circuit configured in such a combination manner, the voltage drop is not offset by a difference between directions in which the driving current flows, whereas there is a possibility of a major factor of a measurement error occurring. A method of improving the measurement error due to the driving current is not particularly disclosed in PTLs 1 to 12. PTL 8 discloses a method of using a drive capacitor in order to drive the switch element as described above, but there is a possibility of an AC signal itself for turning on a switch serving as measurement noise. In order to prevent the measurement noise, it is considered to require a flying capacitor circuit that holds a voltage so as to be measured when a switch on the battery side is turned off. In addition, a capacitive element having a large area has to be used in order to realize the method in the voltage measurement device, which results in an increase in size of the circuit.

A third problem is deterioration in measurement accuracy due to the generation of an unexpected current leak path in a switch element that is in an off-state. For example, a case is considered of using a MOS transistor as each switch element in a MUX circuit that selectively connects a battery cell to one flying capacitor. In order to measure a voltage of one battery cell, when the switch element (the MOS transistor) of the battery cell is turned on, the switch element (the MOS transistor) of another battery cell is turned off. However, even if the MOS transistor of another battery cell is turned off by the control of a gate of the MOS transistor, when there is a voltage relationship in which parasitic diodes electrically conduct between a source and a drain of the MOS transistor, a current path to the switch element being turned off is generated, in addition to a current path from the battery cell to be measured to a flying capacitor, and thus there is a possibility of the current path being viewed as an unexpected load current to the battery cell to be measured. A voltage drop occurs due to the load current and a resistance component in a path from the battery to a MUX circuit output, and thus the voltage drop becomes a factor of a measurement error. As methods of solving the problem, a configuration in which the parasitic diode does not work is suggested in PTLs 3 to 7 mentioned above. However, in these methods, as many flying capacitors as the battery cells have to be embedded, and thus an area of the circuit may increase in size. On the other hand, as in PTL 9 and the like, even in a case where a bidirectional switch that connects sources of two MOS transistors in common with each other and connects gates thereof in common with each other is used as a switch element, when a voltage of a battery to be measured is higher than a source node of a PMOS transistor of the switch element that is in an off-state, a parasitic diode of the PMOS transistor is operated, and thus a load current is generated. In addition, when the voltage of the battery to be measured is lower than a source node of an NMOS transistor of the switch element that is an off-state, a parasitic diode of the NMOS transistor is operated, and thus a load current is generated.

A fourth problem is the occurrence of a device-induced measurement error due to a parasitic capacitance of a switch element and an offset error of an OP amplifier in a flying capacitor type voltage measurement device. As disclosed above in PTL 5 and PTL 9, in the flying capacitor type voltage measurement device, since the parasitic capacitance of the switch element becomes a factor of a measurement error, a measure is required to be taken to increase the measurement accuracy. In both PTL 5 and PTL 9, a process for correcting the error is complicated, which results in an increase in size of a circuit. In particular, as in PTL 9, when an OP amplifier is added between a capacitor and an ADC for a purpose of a buffer or when a sample hold circuit using the OP amplifier is used in the flying capacitor circuit, an offset voltage or the like of the OP amplifier itself may become a factor of the error. There are various methods of correcting the error, but a good deal of effort is required, and thus there is a possibility of a measurement time and power consumption increasing.

In addition, the above-mentioned problems cannot be solved even by any of the techniques disclosed in PTLs 10 to 12.

An object of the present invention is to provide a technique that contributes to the improvement of voltage measurement accuracy and the uniform current consumption of a battery in a voltage measurement device.

The above and other objects and novel features of the present invention will become apparent from the description and the accompanying drawings of the specification.

Means for Solving the Problems

A typical one of embodiments of the invention disclosed in the present application will be summarized as follows.

That is, a switch circuit includes a switch element that is provided between an input terminal and an output terminal, and a switch driving unit that is driven between a first power supply voltage and a second power supply voltage, which are different from each other, with an input voltage, being supplied to the input terminal, interposed therebetween. The switch driving unit includes a source follower circuit and a current control unit. The source follower circuit has a drain side being connected to a first power supply terminal side that is supplied with the first power supply voltage, inputs a voltage based on the input voltage, and supplies a voltage generated in the output side to the switch element as a driving voltage for driving the switch element. The current control unit opens and closes a current path between the output side of the source follower circuit and a second power supply terminal being supplied with the second power supply voltage, in response to the control signal.

Effects of the Invention

An effect obtained by the typical one of embodiments disclosed in the present application will be summarized as follows.

That is, the switch circuit contributes to the improvement of voltage measurement accuracy and the uniform current consumption of a battery in a voltage measurement device.

DESCRIPTION OF EMBODIMENTS

1. Summary of the Embodiments

Figure 1:
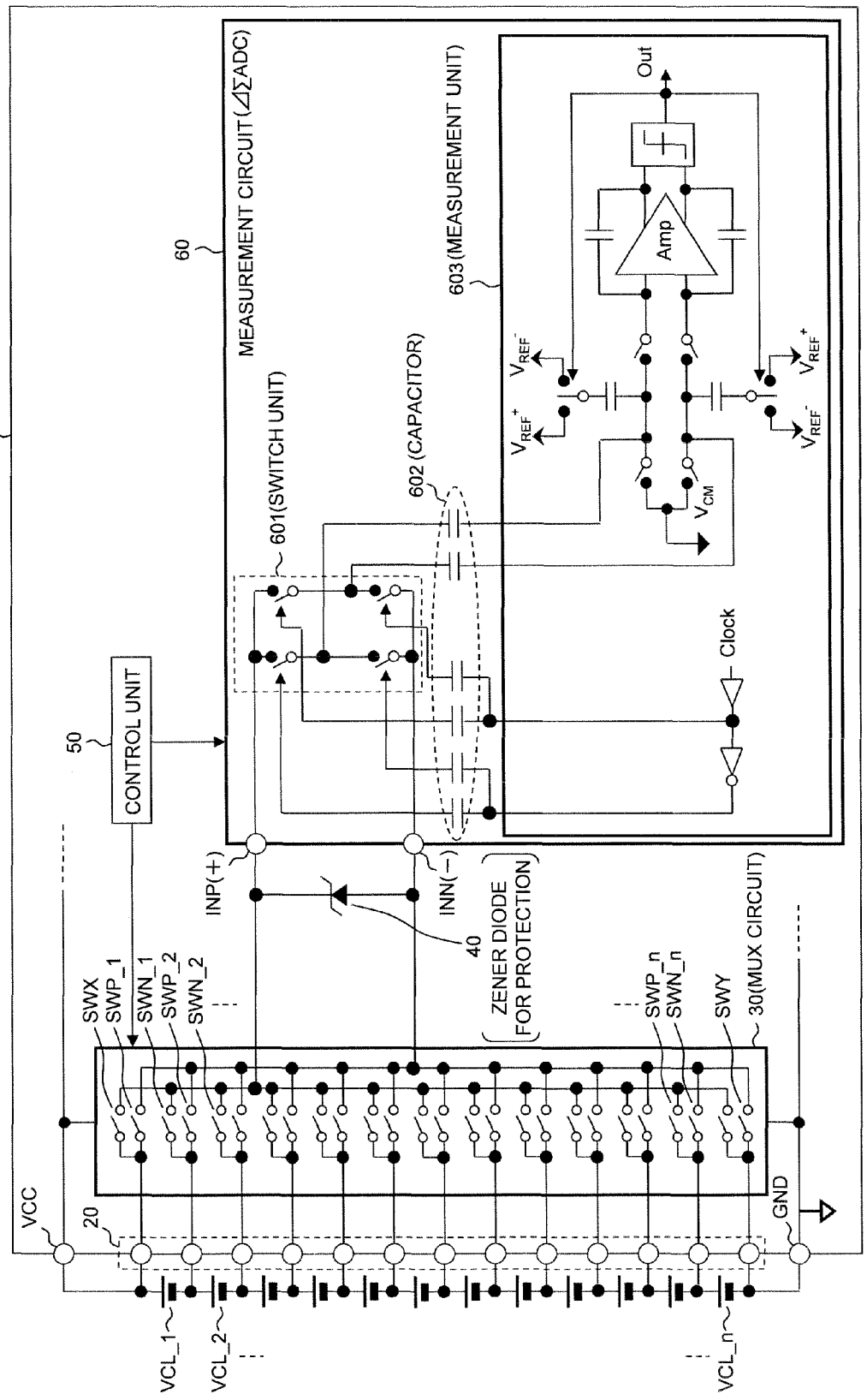
FIG. 1 is a block diagram illustrating an example of a voltage measurement device according to a first embodiment.

First, the summary of typical embodiments of the invention which is disclosed in the present application will be described. Reference numerals and signs in the drawings that are referred to with parentheses applied thereto in the description of the summary of the typical embodiments are merely illustrative of what are included in the concepts of components marked with the reference numerals and signs.

[1] (Switch Circuit of Power Supply Voltage Driving)

Switch circuits (SWP and SWN) according to a typical embodiment of the present invention include switch elements (MP1 and MP2 or MN1 and MN2) which are provided between an input terminal (VIN) and an output terminal (VOUT), and switch driving units (401 to 409) which drive the switch elements on the basis of a control signal (ENABLE) for instructing turn-on or turn-off of the switch element. The switch driving unit is driven between a first power supply voltage (VCC or GND) and a second power supply voltage (GND or VCC), which are different from each other, with an input voltage, being supplied to the input terminal, interposed therebetween. In addition, the switch driving unit includes source follower circuits (401 and 404) and current control units (402 and 405). The source follower circuit has a drain side being connected to a first power supply terminal side that is supplied with the first power supply voltage, inputs a voltage based on the input voltage, and supplies a voltage generated in an output side to the switch element as a driving voltage for driving the switch element. The current control unit opens and closes a current path between the output side of the source follower circuit and a second power supply terminal being supplied with the second power supply voltage, in response to the control signal.

The switch circuit of Paragraph [1] drives the switch element by a driving current flowing between the first power supply terminal and the second power supply terminal through the source follower circuit, rather than supplying a driving current from the input terminal side of the switch circuit. Thus, a voltage drop due to a driving current of a switch and resistance components between input and output terminals of the switch does not occur, and power on the input terminal side is never consumed to drive the switch. Therefore, the application of the switch circuit of Paragraph [1] to the MUX circuit of the voltage measurement device mentioned above can allow the first and second problems mentioned above to be solved.

[2] (Details of Switch Circuit)

In the switch circuit of Paragraph [1], the switch element includes a first conductive type first MOS transistor (MP1 or MN2) and a first conductive type second MOS transistor (MP2 or MN2). The first conductive type first MOS transistor has a drain terminal being connected to the input terminal side and a gate terminal being supplied with the driving voltage. The first conductive type second MOS transistor has a drain terminal being connected to the output terminal side, a gate terminal being connected to the gate terminal side of the first MOS transistor, and a source terminal being connected in common with a source terminal of the first MOS transistor. The source follower circuit includes a second conductive type third MOS transistor (MN3 or MP5) and voltage generation units (R1, R2). The second conductive type third MOS transistor has a drain terminal being connected to the first power supply terminal side and a gate terminal being connected to the source terminal sides of the first MOS transistor and the second MOS transistor. The voltage generation unit has one end being connected to a source terminal side of the third MOS transistor and the other end being connected to the gate terminal sides of the first MOS transistor and the second MOS transistor, and generates a voltage in both ends thereof based on a current to be supplied. The current control unit opens a current path between the other end of the voltage generation unit and the second power supply terminal when the control signal instructs turn-on of the switch element, and closes the current path when the control signal instructs turn-off of the switch element.

According to this, it is possible to realize the switch circuit of Paragraph [1] with a simple configuration. In addition, since a voltage between the gate and the source of the first MOS transistor and the second MOS transistor is generated on the basis of a current flowing to the voltage generation unit, it is possible to generate an on-voltage that does not depend on the input voltage.

[3] (Switch Circuit Including Constant Current Type Off Acceleration Circuit)

In the switch circuit of Paragraph [1] or [2], the switch driving unit further includes off acceleration units (403, 406) that form a current path through which a current, which is smaller than a current flowing through a current path formed by the current control unit, flows, between the first power supply terminal and the source terminals of the first MOS transistor and the second MOS transistor, through the other end of the voltage generation unit and the gate terminals of the first MOS transistor and the second MOS transistor.

According to this, since a potential of a node of the other end of the voltage generation unit transitions to the first power supply voltage side when the switch element is in an off-state, the off-state of the switch element is further stabilized. In addition, since potentials of the source terminals of the first MOS transistor and the second MOS transistor transition to the first power supply voltage side, it is possible to prevent charge from moving through parasitic diodes of the first MOS transistor and the second MOS transistor which are in an off-state. Therefore, for example, the application of the switch circuit of Paragraph [3] to the MUX circuit of the voltage measurement device mentioned above can allow not only the above-mentioned first and second problems but also the third problem to be solved.

[4] (Switch Circuit Including Switch Type Off Acceleration Circuit)

In the switch circuit of Paragraph [1] or [2], the switch driving unit further includes off acceleration units (407 to 409) that perform the formation thereof through the other end of the voltage generation unit, between the first power supply terminal and the source terminals of the first MOS transistor and the second MOS transistor, during a predetermined period in a period in which the current control unit closes a current path.

According to this, similarly to Paragraph [3], an off-state of the switch element is further stabilized, and thus it is possible to prevent charge from moving through parasitic diodes of the first MOS transistor and the second MOS transistor which are in an off-state. Therefore, for example, the application of the switch circuit of Paragraph [3] to the MUX circuit of the voltage measurement device mentioned above can allow not only the first and second problems mentioned above but also the third problem to be solved. In addition, the off acceleration unit can reduce the current consumption because the off acceleration unit does not supply a current when the switch element in an on-state, and contributes to the improvement of on-voltage accuracy because the off acceleration unit may consider only a current flowing to the current control unit as a current flowing to the voltage generation unit for determining the on-voltage of the switch element. Furthermore, since the off acceleration unit is operated in a switch manner, it is possible to further reduce a time until the switch element transitions to an off-state, as compared with a case where the off acceleration unit is operated by a constant current, and to prevent charge from moving through a parasitic diode at an earlier timing.

[5] (Off Acceleration Circuit: One-Shot Signal)

In the switch circuit of Paragraph [4], the period in which the off acceleration unit forms the current path is a portion (a high level period of an off signal of FIG. 11) of the period in which the current control unit closes the current path.

[6] (Off Acceleration Circuit: Inversion Signal)

In the switch circuit of Paragraph [4], the period in which the off acceleration unit forms the current path is a period (a high level period of an off signal of FIG. 13 or FIG. 15) which corresponds to the period in which the current control unit closes the current path.

According to this, the period in which the off acceleration unit forms the current path can be set to, for example, a period in which an off state of the switch element is instructed, thereby allowing a design to be facilitated.

[7] (Switch Circuit (Pch))

In the switch circuit of any of Paragraphs [2] to [6], the first power supply voltage is set to a voltage value (VCC) equal to or greater than the input voltage, the first conductive type is a P-channel type, and the second conductive type is an N-channel type.

[8] (Switch Circuit (Nch))

In the switch circuit of any of Paragraphs [2] to [6], the first power supply voltage is set to a ground voltage, the second power supply voltage is set to a voltage value (VCC) equal to or greater than the input voltage, the first conductive type is an N-channel type, and the second conductive type is a P-channel type.

[9] (Multiplexer Circuit Including Switch Circuit of Power Supply Voltage Driving)

A selection circuit (30) according to a typical embodiment of the present invention is configured such that each block, which is constituted by one or a plurality of unit cells among a plurality of unit cells (VCL_1 to VCL_n) constituting an assembled battery by one ends and the other ends thereof being connected to each other, is assumed to be one unit, and that signal lines connected to both ends of any of the blocks are selected in response to a control signal to be input and are connected to a first output terminal (INP(+)) and a second output terminal (INN(−)). The selection circuit includes a first switch circuit (SWP) and a second switch circuit (SWN) with respect to each of the blocks. The first switch circuit has an input terminal (VIN) being connected to the signal line that is connected to one end (a positive electrode of the battery cell VCL) of the block, and an output terminal (VOUT) being connected to the signal line that is connected to the first output terminal, and electrically connects the input terminal and the output terminal to each other in response to the control signal. The second switch circuit has an input terminal (VIN) being connected to the signal line that is connected to the other end (a negative electrode of the battery cell VCL) of the block, and an output terminal (VOUT) being connected to the signal line that is connected to the second output terminal, and electrically connects the input terminal and the output terminal to each other in response to the control signal. In addition, the first switch circuit and the second switch circuit include switch elements (MP1 and MP2 or MN1 and MN2) which are provided between the input terminal and the output terminal of the switch circuit, and switch driving units (401 to 409) that drive the switch element in response to the control signal. The switch driving unit includes source follower circuits (401 and 404) and current control units (402 and 405). The source follower circuits are provided between a first power supply terminal being supplied with the first power supply voltage (VCC or GND) and a second power supply terminal being supplied with the second power supply voltage (GND or VCC), input a voltage based on the input voltage, and supply a voltage generated in the output side to the switch element as a driving voltage for driving the switch element. The current control units open and close a current path in which the source follower circuits between the first power supply terminal and the second power supply terminal are disposed, in response to the control signal.

According to this, similarly to Paragraph [1], according to the first switch circuit and the second switch circuit, a voltage drop due to a driving current of a switch and resistance components between the input and output terminals of the switch does not occur, and power on the input terminal side is never consumed to drive the switch. Therefore, for example, the application of the selection circuit of Paragraph [9] as the MUX circuit of the voltage measurement device mentioned above can allow the first and second problems mentioned above to be solved.

[10] (VCC is Battery Voltage)

In the selection circuit of Paragraph [9], the first power supply voltage is a voltage (a voltage of a positive electrode of VCL_1) based on a voltage of one end of the highest level of unit cell among the unit cells constituting the assembled battery.

In the selection circuit of Paragraph [10], driving currents of the first switch circuit and the second switch circuit are supplied from the assembled battery. That is, since power is uniformly consumed from each unit cell in the selecting operation of the selection circuit, it is possible to maintain balanced battery energy consumption between the unit cells.

[11] (Switch Circuits in Each Block are the Same Type of Transistors)

In the selection circuit of Paragraph [10], the switch element includes P-type MOS transistors (MP1 and MP2) or N-type MOS transistors (MN1 and MN2) of which gate terminals are controlled by the driving voltage, and the types of transistors of switch elements of the first switch circuit and the second switch circuit which correspond to the block are made the same as each other.

Since the types of switch elements connected to the respective electrodes of the block to be selected are made the same as each other, a selection circuit of Paragraph [11] contributes to a reduction in difference between resistance components from the electrodes of the block to the first output terminal and resistance components from the electrodes of the block to the second output terminal.

[12] (Method of Connecting the Same Types of Switch Circuits)

In the selection circuit of any of Paragraphs [9] to [11], switch elements of the first switch circuit and the second switch circuit which correspond to a first block, in which a potential of the other end is equal to or greater than a predetermined potential (VT), in the blocks are P-type MOS transistors (MP1 and MP2), and switch elements of the first switch circuit and the second switch circuit which correspond to a second block, in which a potential of the other end is lower than the predetermined potential, in the blocks are set to N-type MOS transistors (MN1 and MN2).

According to this, even when the N-type MOS transistor and the P-type MOS transistor are used as the switch elements of the first switch circuit and the second switch circuit, the types of switch elements connected to both ends of each of the blocks can be made the same as each other.

[13] (Details of Switch Circuit (Pch))

In the selection circuit of Paragraph [12], the switch elements of the first switch circuit and the second switch circuit which correspond to the first block include a P-type first MOS transistor (MP1) and a P-type second MOS transistor (MP2). The P-type first MOS transistor has a drain terminal being connected to the input terminal side and a gate terminal being supplied with the driving voltage. The P-type second MOS transistor has a drain terminal being connected to the output terminal side, a gate terminal being connected to the gate terminal side of the first MOS transistor, and a source terminal being connected in common with a source terminal of the first MOS transistor. In addition, the source follower circuits (401) of the first switch circuit and the second switch circuit which correspond to the first block include an N-type third MOS transistor (MN3) and a voltage generation unit (R1). The N-type third MOS transistor has a drain terminal being connected to the first power supply terminal side and a gate terminal being connected to the source terminal sides of the first MOS transistor and the second MOS transistor. The voltage generation unit has one end being connected to a source terminal side of the third MOS transistor and the other end being connected to the gate terminal sides of the first MOS transistor and the second MOS transistor, and generates a voltage in both ends based on a current to be supplied. Furthermore, the current control units (402) of the first switch circuit and the second switch circuit which correspond to the first block open a current path between the other end of the voltage generation unit and the second power supply terminal (GND) when the control signal (ENABLE) instructs turn-on of the switch element, and close the current path when the control signal instructs turn-off of the switch element.

According to this, similarly to Paragraph [2], it is possible to realize the first switch circuit and the second switch circuit with a simple configuration. In addition, since a voltage between the gate and the source of the first MOS transistor and the second MOS transistor is generated on the basis of a current flowing to the voltage generation unit, it is possible to generate an on-voltage that does not depend on the input voltage.

[14] (Details of Switch Circuit (Nch))

In the selection circuit of Paragraph [12] or [13], the switch elements of the first switch circuit and the second switch circuit which correspond to the second block include an N-type fourth MOS transistor (MN1) and an N-type fifth MOS transistor (MN2). The N-type fourth MOS transistor has a drain terminal being connected to the input terminal side and a gate terminal being supplied with the driving voltage. The N-type fifth MOS transistor has a drain terminal being connected to the output terminal side, a gate terminal being connected to the gate terminal side of the fourth MOS transistor, and a source terminal being connected in common with a source terminal of the fourth MOS transistor. In addition, the source follower circuits (404) of the first switch circuit and the second switch circuit which correspond to the second block include a P-type sixth MOS transistor (MP5) and a voltage generation unit (R2). The P-type sixth MOS transistor has a drain terminal being connected to the second power supply terminal side and a gate terminal being connected to the source terminal sides of the fourth MOS transistor and the fifth MOS transistor. The voltage generation unit has one end being connected to a source terminal side of the sixth MOS transistor and the other end being connected to the gate terminal sides of the fourth MOS transistor and the fifth MOS transistor, and generates a voltage in both ends based on a current to be supplied. Furthermore, the current control units of the first switch circuit and the second switch circuit which correspond to the second block open a current path between the other end of the voltage generation unit and the first power supply terminal (VCC) when the control signal instructs turn-on of the switch element, and close the current path when the control signal instructs turn-off of the switch element.

According to this, similarly to Paragraph [2], it is possible to realize the first switch circuit and the second switch circuit with a simple configuration. In addition, since a voltage between the gate and the source of the fourth MOS transistor and the fifth MOS transistor is generated on the basis of a current flowing to the voltage generation unit, it is possible to generate an on-voltage that does not depend on the input voltage.

[15] (Switch Circuit Including Constant Current Type Off Acceleration Circuit)

In the selection circuit of any of Paragraphs [12] to [14], the switch driving units of the first switch circuit and the second switch circuit which correspond to the first block further include an off acceleration unit (403) that forms a current path through which a current, which is smaller than a current flowing to a current path formed by the current control unit, flows, between the first power supply terminal (VCC) and the source terminals of the first MOS transistor and the second MOS transistor through the other end of the voltage generation unit.

According to this, similarly to Paragraph [3], in the first switch circuit and the second switch circuit in which the switch element is constituted by a P-type MOS transistor, an off-state of the switch element is further stabilized, and it is possible to prevent charge from moving through parasitic diodes of the first MOS transistor and the second MOS transistor which are in an off-state. Therefore, for example, the application of the selection circuit of Paragraph [15] as the MUX circuit of the voltage measurement device mentioned above can allow not only the first and second problems mentioned above but also the third problem to be solved.

[16] (Switch Circuit Including Switch Type Off Acceleration Circuit)

In the selection circuit of any of Paragraphs [12] to [14], the switch driving units of the first switch circuit and the second switch circuit which correspond to the first block further include off acceleration units (407 and 408) that perform the formation thereof through the other end of the voltage generation unit between the first power supply terminal and source terminals of the first MOS transistor and the second MOS transistor, during a time when the current control unit closes a current path.

According to this, similarly to Paragraph [4], in the first switch circuit and the second switch circuit in which the switch element is constituted by a P-type MOS transistor, an off-state of the switch element is further stabilized, and it is possible to prevent charge from moving through a parasitic diode that is in an off-state. Therefore, according to the selection circuit of Paragraph [16], it is possible to solve not only the first and second problems mentioned above but also the third problem, similar to Paragraph [15]. In addition, similarly to Paragraph [4], the off acceleration unit can reduce current consumption, and contributes to the improvement of on-voltage accuracy of the switch element. Furthermore, since the off acceleration unit is operated in a switch manner, it is possible to further reduce a time until the switch element transitions to an off-state as compared with a case where the off acceleration unit is operated by a constant current, and to prevent charge from moving through a parasitic diode at an earlier timing.

[17] (Switch Circuit Including Constant Current Type Off Acceleration Circuit)

In the selection circuit of any of Paragraphs [12] to [16], the switch driving units of the first switch circuit and the second switch circuit which correspond to the second block further include an off acceleration unit (406) that forms a current path through which a current, which is smaller than a current flowing through a current path formed by the current control unit, flows, between the second power supply terminal and the source terminals of the fourth MOS transistor and the fifth MOS transistor through the other end of the voltage generation unit.

According to this, similarly to Paragraph [15], in the first switch circuit and the second switch circuit in which the switch element is constituted by an N-type MOS transistor, an off-state of the switch element is further stabilized, and it is possible to prevent charge from moving through parasitic diodes of the fourth MOS transistor and the fifth MOS transistor which are in an off-state. Therefore, for example, the application of the selection circuit of Paragraph [17] as the MUX circuit of the voltage measurement device mentioned above can allow not only the first and second problems mentioned above but also the third problem to be solved.

[18] (Switch Circuit Including Switch-Type Off Acceleration Circuit)

In the selection circuit of any of Paragraphs [12] to [16], the switch driving units of the first switch circuit and the second switch circuit which correspond to the second block further include an off acceleration unit (409) that performs the formation thereof through the other end of the voltage generation unit between the second power supply terminal and the source terminals of the fourth MOS transistor and the fifth MOS transistor during a period in which the current control unit closes a current path.

According to this, similarly to Paragraph [16], in the first switch circuit and the second switch circuit in which the switch element is constituted by an N-type MOS transistor, an off-state of the switch element is further stabilized, and it is possible to prevent charge from moving through a parasitic diode that is in an off-state. Therefore, according to the selection circuit of Paragraph [18], it is possible to solve not only the first and second problems mentioned above but also the third problem, similar to Paragraph [16]. In addition, similarly to Paragraph [16], the off acceleration unit can reduce current consumption, and contributes to the improvement of on-voltage accuracy of the switch element. Furthermore, since the off acceleration unit is operated in a switch manner, it is possible to further reduce a time until the switch element transitions to an off-state as compared with a case where the off acceleration unit is operated by a constant current, and to prevent charge from moving through a parasitic diode at an earlier timing.

[19] (Battery Voltage Measurement Device for Measuring Battery Voltage Including Switch Circuit of Power Supply Voltage Driving)

A voltage measurement device (2) according to a typical embodiment of the present invention is a voltage measurement device that is configured such that a block, which is constituted by one or a plurality of unit cells among a plurality of unit cells (VCL_1 to VCL_n) constituting an assembled battery by one ends and the other ends thereof being connected to each other, is assumed to be one unit, and that voltages of both ends of the block are measured with respect to each block. The voltage measurement device includes a selection unit (30) and a measurement unit (60). The selection unit selects signal lines connected to both ends of the block with respect to each block and connects the selected signals to a first output terminal (INP (+)) and a second output terminal (INN(−)), in response to a control signal to be input. The measurement unit inputs voltages of the first output terminal and the second output terminal and measures a voltage between both terminals. The selection unit includes a first switch circuit (SWP) and a second switch circuit (SWN) with respect to each of the blocks. The first switch circuit has an input terminal (VIN) being connected to the signal line that is connected to one end (a positive electrode of a battery cell) of the block and an output terminal (VOUT) being connected to the signal line that is connected to the first output terminal, and electrically connects the input terminal and the output terminal to each other in response to the control signal. The second switch circuit has an input terminal (VIN) being connected to the signal line that is connected to the other end (a negative electrode of the battery cell) of the block and an output terminal (VOUT) being connected to the signal line that is connected to the second output terminal, and electrically connects the input terminal and the output terminal to each other in response to the control signal. In addition, the first switch circuit and the second switch circuit include switch elements (MP1 and MP2 or MN1 and MN2) which are provided between the input terminal (VIN) and the output terminal (VOUT) of the switch circuit, and switch driving units (401 to 409) that drive the switch element in response to the control signal. The switch driving unit includes source follower circuits (401 and 404) and current control units (402 and 405). The source follower circuit is provided between a first power supply terminal being supplied with the first power supply voltage (VCC or GND) and a second power supply terminal being supplied with the second power supply voltage (GND or VCC), inputs a voltage in response to the input voltage, and supplies a voltage generated in the output side to the switch element as a driving voltage for driving the switch element. The current control unit opens and closes a current path in which the source follower circuit between the first power supply terminal and the second power supply terminal is disposed, in response to the control signal.

In the voltage measurement device of Paragraph [19], similarly to Paragraph [1], since driving currents of the first switch circuit and the second switch circuit flow between the first power supply terminal and the second power supply terminal, a voltage drop due to a driving current of a switch and resistance components between the input and output terminals of the switch does not occur, and power on the input terminal side is never consumed to drive the switch. In addition, according to the voltage measurement device of Paragraph [19], since the voltage measurement device that does not employ a flying capacitor type can be configured, it is possible to reduce a device-induced measurement error due to a parasitic capacitance of the switch element and to prevent the generation of an error due to the use of a buffer or an amplification circuit for sampling, in measuring a voltage. Therefore, for example, the application of the voltage measurement device of Paragraph [19] as the above-mentioned voltage measurement device can allow the first, second, and fourth problems mentioned above to be solved.

[20] (VCC is Battery Voltage)

In the voltage measurement device of Paragraph [19], the first power supply voltage is a voltage (a voltage of a positive electrode of VCL_1) based on a voltage of one end of the highest level of unit cell among the unit cells constituting the assembled battery.

According to this, similarly to Paragraph [10], since power is uniformly consumed from each unit cell in the selection operation of the selection circuit in the voltage measurement device, it is possible to maintain balanced battery energy consumption between the unit cells.

[21] (Switch Circuits in Each Block are the Same Type of Transistors)

In the voltage measurement device of Paragraph [19] or [20], the switch element includes P-type MOS transistors (MP1 and MP2) or N-type MOS transistors (MN1 and MN2) of which gate terminals are controlled by the driving voltage, and the types of transistors of switch elements of the first switch circuit and the second switch circuit which correspond to the block are made the same as each other.

According to this, similarly to Paragraph [11], the types of switch elements connected to the respective electrodes of the block to be selected are made the same as each other, thereby contributing to a reduction in difference between resistance components of a signal path from a positive electrode of the block to be measured to the first output terminal and a resistance component of a signal path from a negative electrode of the block to the second output terminal. Thus, for example, even when in-phase noise due to disturbance occurs, it is possible to prevent differential noise from occurring in an input of a measurement unit. Therefore, for example, even if a delta-sigma type analog/digital converter that requires a relatively long measurement time is used, it is possible to prevent a degradation in a noise reduction performance in the whole voltage measurement system and to prevent the generation of a measurement error.

[22] (Method of Connecting the Same Type of Switch Circuits)

In the voltage measurement device of any of Paragraphs [19] to [21], switch elements of the first switch circuit and the second switch circuit which correspond to a first block, in which a potential of the other end is equal to or greater than a predetermined potential (VT), in the blocks are P-type MOS transistors (MP1 and MP2), and switch elements of the first switch circuit and the second switch circuit which correspond to a second block, in which a potential of the other end is lower than the predetermined potential, in the blocks are N-type MOS transistors (MN1 and MN2).

According to this, similarly to Paragraph [12], even when the N-type MOS transistor and the P-type MOS transistor are used as the switch elements of the first switch circuit and the second switch circuit, the types of switch elements connected to both ends of each of the blocks can be made the same as each other.

[23] (Details of Switch Circuit (Pch))

In the voltage measurement device of Paragraph [22], the switch elements of the first switch circuit and the second switch circuit which correspond to the first block include a P-type first MOS transistor (MP1) and a P-type second MOS transistor (MP2). The P-type first MOS transistor has a drain terminal being connected to the input terminal side and a gate terminal being supplied with the driving voltage. The P-type second MOS transistor (MP2) has a drain terminal being connected to the output terminal side, a gate terminal being connected to the gate terminal side of the first MOS transistor, and a source terminal being connected in common with a source terminal of the first MOS transistor. In addition, the source follower circuits (401) of the first switch circuit and the second switch circuit which correspond to the first block include an N-type third MOS transistor (MN3) and a voltage generation unit (R1). The N-type third MOS transistor has a drain terminal being connected to the first power supply terminal side and a gate terminal being connected to the source terminal sides of the first MOS transistor and the second MOS transistor. The voltage generation unit has one end being connected to a source terminal side of the third MOS transistor and the other end being connected to the gate terminal sides of the first MOS transistor and the second MOS transistor, and generates a voltage in both ends based on a current to be supplied. The current control units of the first switch circuit and the second switch circuit which correspond to the first block open a current path between the other end of the voltage generation unit and the second power supply terminal (GND) when the control signal instructs turn-on of the switch element, and close the current path when the control signal instructs turn-off of the switch element.

According to this, similarly to Paragraph [13], it is possible to realize the first switch circuit and the second switch circuit with a simple configuration. In addition, since a voltage between the gate and the source of the first MOS transistor and the second MOS transistor is generated on the basis of a current flowing to the voltage generation unit, it is possible to generate an on-voltage that does not depend on the input voltage.

[24] (Details of Switch Circuit (Nch))

In the voltage measurement device of Paragraph [22] or [23], the switch elements of the first switch circuit and the second switch circuit which correspond to the second block include an N-type fourth MOS transistor (MN1) and an N-type fifth MOS transistor (MN2). The N-type fourth MOS transistor has a drain terminal being connected to the input terminal side and a gate terminal being supplied with the driving voltage. The N-type fifth MOS transistor has a drain terminal being connected to the output terminal side, a gate terminal being connected to the gate terminal side of the fourth MOS transistor, and a source terminal being connected in common with a source terminal of the fourth MOS transistor. In addition, the source follower circuits (404) of the first switch circuit and the second switch circuit which correspond to the second block include a P-type sixth MOS transistor (MP5) and a voltage generation unit (R2). The P-type sixth MOS transistor has a drain terminal being connected to the second power supply terminal side and a gate terminal being connected to the source terminal sides of the fourth MOS transistor and the fifth MOS transistor. The voltage generation unit has one end being connected to a source terminal side of the sixth MOS transistor and the other end being connected to the gate terminal sides of the fourth MOS transistor and the fifth MOS transistor, and generates a voltage in both ends based on a current to be supplied. Furthermore, the current control units (405) of the first switch circuit and the second switch circuit which correspond to the second block open a current path between the other end of the voltage generation unit and the first power supply terminal (VCC) when the control signal instructs turn-on of the switch element, and close the current path when the control signal instructs turn-off of the switch element.

According to this, similarly to Paragraph [14], it is possible to realize the first switch circuit and the second switch circuit with a simple configuration. In addition, since a voltage between the gate and the source of the fourth MOS transistor and the fifth MOS transistor is generated on the basis of a current flowing to the voltage generation unit, it is possible to generate an on-voltage that does not depend on the input voltage.

[25] (Switch Circuit Including Constant Current-Type Off Acceleration Circuit (Pch))

In the voltage measurement device of any of Paragraphs [22] to [24], the switch driving units of the first switch circuit and the second switch circuit which correspond to the first block further include an off acceleration unit (403) that forms a current path through which a current, which is smaller than a current flowing to a current path formed by the current control unit, flows, between the first power supply terminal and source terminals of the first MOS transistor and the second MOS transistor through the other end of the voltage generation unit.

According to this, similarly to Paragraph [15], in the first switch circuit and the second switch circuit in which the switch element is constituted by a P-type MOS transistor, an off-state of the switch element is further stabilized, and it is possible to prevent charge from moving through parasitic diodes of the first MOS transistor and the second MOS transistor which are in an off-state. Therefore, for example, according to the voltage measurement device of Paragraph [25], it is possible to solve not only the first, second, and fourth problems mentioned above but also the third problem.

[26] (Switch Circuit Including Switch Type Off Acceleration Circuit (Pch))

In the voltage measurement device of any of Paragraphs [22] to [24], the switch driving units of the first switch circuit and the second switch circuit which correspond to the first block further include off acceleration units that form a current path through the other end of the voltage generation unit between the first power supply terminal and source terminals of the first MOS transistor and the second MOS transistor, during a time when the current control unit closes a current path.

According to this, similarly to Paragraph [16], it is possible to solve not only the first and second problems mentioned above but also the third problem. In addition, similarly to Paragraph [16], since the off acceleration unit is operated in a switch manner, it is possible to further reduce a time until the switch element transitions to an off-state as compared with a case where the off acceleration unit is operated by a constant current, and to prevent charge from moving through a parasitic diode at an earlier timing.

[27] (Switch Circuit Including Constant Current Type Off Acceleration Circuit (Nch))

In the voltage measurement device of any of Paragraphs [22] to [26], the switch driving units of the first switch circuit and the second switch circuit which correspond to the second block further include an off acceleration unit (406) that forms a current path through which a current, which is smaller than a current flowing through a current path formed by the current control unit, flows, between the second power supply terminal and the source terminals of the fourth MOS transistor and the fifth MOS transistor through the other end of the voltage generation unit.

According to this, similarly to Paragraph [16], in the first switch circuit and the second switch circuit in which the switch element is constituted by an N-type MOS transistor, an off-state of the switch element is further stabilized, and it is possible to prevent charge from moving through parasitic diodes of the fourth MOS transistor and the fifth MOS transistor which are in an off-state. Therefore, for example, according to the voltage measurement device of Paragraph [26], it is possible to solve not only the first, second, and fourth problems mentioned above but also the third problem.

[28] (Switch Circuit Including Switch Type Off Acceleration Circuit (Nch))

In the voltage measurement device of any of Paragraphs [22] to [26], the switch driving units of the first switch circuit and the second switch circuit which correspond to the second block further include off acceleration units that form a current path through the other end of the voltage generation unit between the second power supply terminal and the source terminals of the first MOS transistor and the second MOS transistor, during a time when the current control unit closes a current path.

According to this, similarly to Paragraph [18], it is possible to solve not only the first and second problems mentioned above but also the third problem. In addition, similarly to Paragraph [18], since the off acceleration unit is operated in a switch manner, it is possible to further reduce a time until the switch element transitions to an off-state as compared with a case where the off acceleration unit is operated by a constant current, and to prevent charge from moving through a parasitic diode at an earlier timing.

[29] (ADC is Battery Voltage Measurement Device for Measuring Battery Voltage which is $\Delta \cdot \Sigma$-Type ADC)

In the voltage measurement device of any of Paragraphs [19] to [28], the measurement unit includes delta-sigma type analog/digital converters (601 to 603).

2. Further Detailed Description of the Embodiments

Embodiments will be described below in more detail.

(First Embodiment)

FIG. 1 is a block diagram illustrating an example of a voltage measurement device according to a first embodiment.

A voltage measurement device 2 shown in FIG. 1 measures voltages of both ends in each group (hereinafter, referred to as "block") of battery cells constituted by one or a plurality of battery cells among a plurality of battery cells VCL_1 to VCL_n (the battery cell is simply denoted by a VCL, collectively) which are connected to each other in series. Herein, as an example, the block is assumed to be one battery cell. That is, it is assumed that the voltage measurement device 2 measures a voltage by selecting one battery cell from the plurality of battery cells VCL that are connected to each other in series. Meanwhile, the plurality of battery cells VCL that are connected to each other in series are not limited to a battery cell array in which the battery cells are serially connected to each other in a line, but also refer to a plurality of battery cell arrays, each including a plurality of battery cell arrays being connected to each other in series, which are connected to each other in parallel. In addition, the plurality of battery cells being connected to each other in parallel are regarded as one battery, a plurality of which being connected to each other in series are also referred to the plurality of battery cells.

The voltage measurement device 2 includes a voltage input terminal 20 for inputting voltages from electrodes of both ends of each block, power supply terminals VCC and GND for inputting a power supply voltage, a MUX circuit 30 for selecting and outputting one battery voltage to be measured, a measurement circuit 60 for measuring a voltage difference to be input, and a protection element 40. Meanwhile, for the purpose of simplification, FIG. 1 shows only functional units related to voltage measurement among functional units of the voltage measurement device 2.

Figure 2:
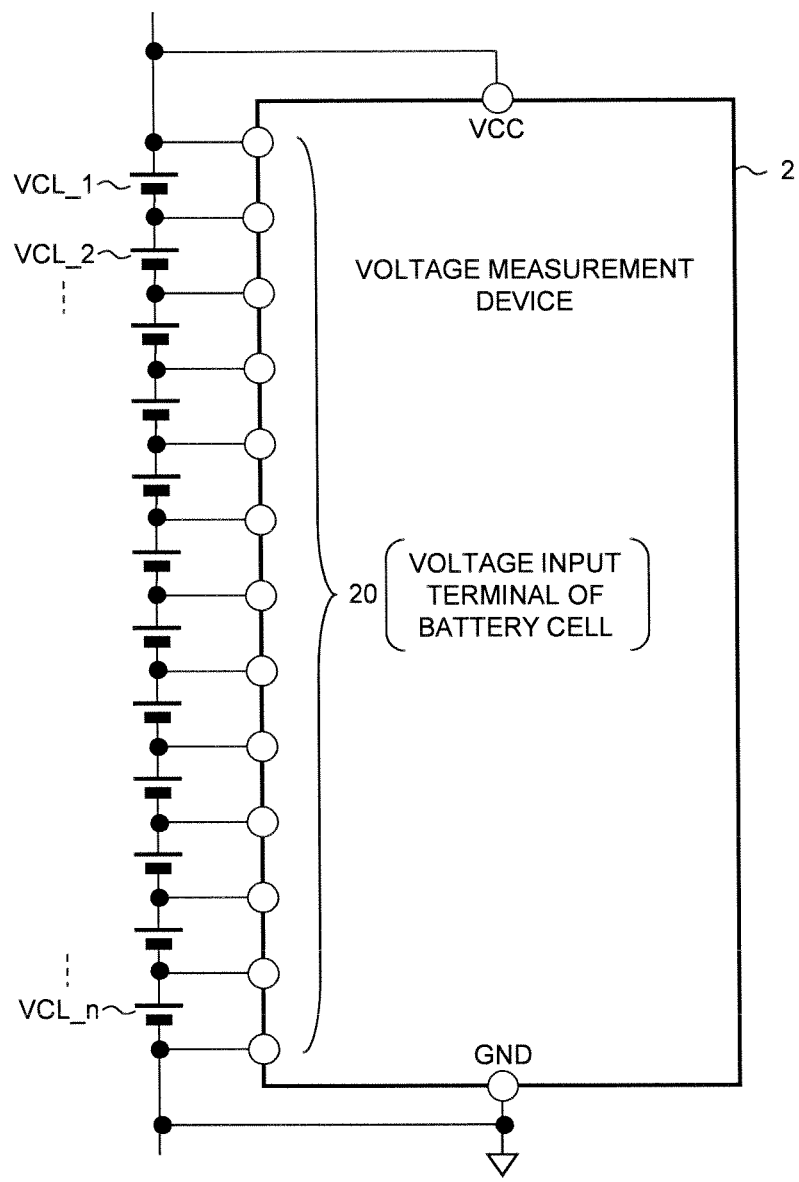
FIG. 2 is a diagram illustrating an example in which a voltage measurement device 2 supplies power.

A power supply of the voltage measurement device 2 is supplied from, for example, the plurality of battery cells VCL. FIG. 2 is a diagram illustrating an example in which the voltage measurement device 2 supplies power. As illustrated in FIG. 2, in the voltage measurement device 2, a voltage of a positive electrode of the highest level of battery cell VCL_1 among the plurality of battery cells VCL is supplied to the power supply terminal VCC, and a voltage of a negative electrode of the lowest level of battery cell VCL_n among the plurality of battery cells VCL is supplied to the power supply terminal GND.

The MUX circuit 30 includes a plurality of switch circuits for connecting a signal path, which is connected to each of a plurality of the voltage input terminals 20, and two input terminals INP(+) and INN(−) of the measurement circuit 60. Specifically, the MUX circuit 30 includes switch Circuits SWP_1 to SWP_n (the switch circuit is simply denoted by SWP, collectively) and switch circuits SWN_1 to SWN_n (the switch circuit is simply denoted by SWN, collectively). The switch circuits SWP_1 to SWP_n connect the positive electrode of the battery cell VCL and the positive input terminal INP(+) of the measurement unit 60. The switch circuits SWN_1 to SWN_n connect the negative electrode of the battery cell VCL and the negative input terminal INN(−) of the measurement unit 60. That is, when a number of the plurality of battery cells is set to N, the MUX circuit 30 requires 2N switch circuits in order to measure a voltage of each of the battery cells. Meanwhile, FIG. 1 shows a case where the MUX circuit includes 2N+2 switch circuits including a switch circuit SWX, which connects the voltage input terminal 20 for inputting a positive voltage of the highest level of battery cell and the negative input terminal INN of the measurement circuit 60, and a switch circuit SWY that connects the voltage input terminal 20 for inputting a negative voltage of the lowest level of battery cell and the positive input terminal INP of the measurement circuit 60. However, the two switch circuits may not be included, and are appropriately disposed in accordance with a system or the like to which the MUX circuit 30 is applied.

In the switch circuits SWP and SWN, an on-state and an off-state of a switch is controlled by a control signal from the control unit 50. For example, when a voltage of a predetermined battery cell is measured, the control unit 50 controls the switch circuit of the MUX circuit 30 so that voltages of both ends of the battery cell are applied between the input terminals of the measurement circuit 60. Details of the MUX circuit 30 will be described below.

The protection element 40 is a protection element, which is connected between two input terminals INP and INN of the measurement circuit 60, for protecting input stages of the measurement circuit 60, and the protection element is, for example, a zener diode.

The control unit 50 controls the MUX circuit 30 and the measurement circuit 60 so as to perform the overall control for the voltage measurement of each battery cell. The control unit 50 is, for example, a dedicated logic circuit or a microcomputer.

The measurement circuit 60 measures a potential difference that is input to the two input terminals INP and INN in response to the control signal from the control unit 50, and outputs the measurement result. For example, the measurement circuit 60 is realized by a delta-sigma type A/D converter. For example, the measurement circuit 60 includes a switch unit 601 and a capacitor 602 for retrieving voltages that are input to the input terminals INP and INN, and a measurement unit 603 that inputs the retrieved voltages and measures the voltages. The capacitor 602 is a high withstand voltage element, and the measurement unit 603 is a circuit that is constituted by a low withstand voltage element.

A measurement operation of the voltage measurement device 2 will be briefly described below with reference to FIG. 3 and FIG. 4.

Figure 3:
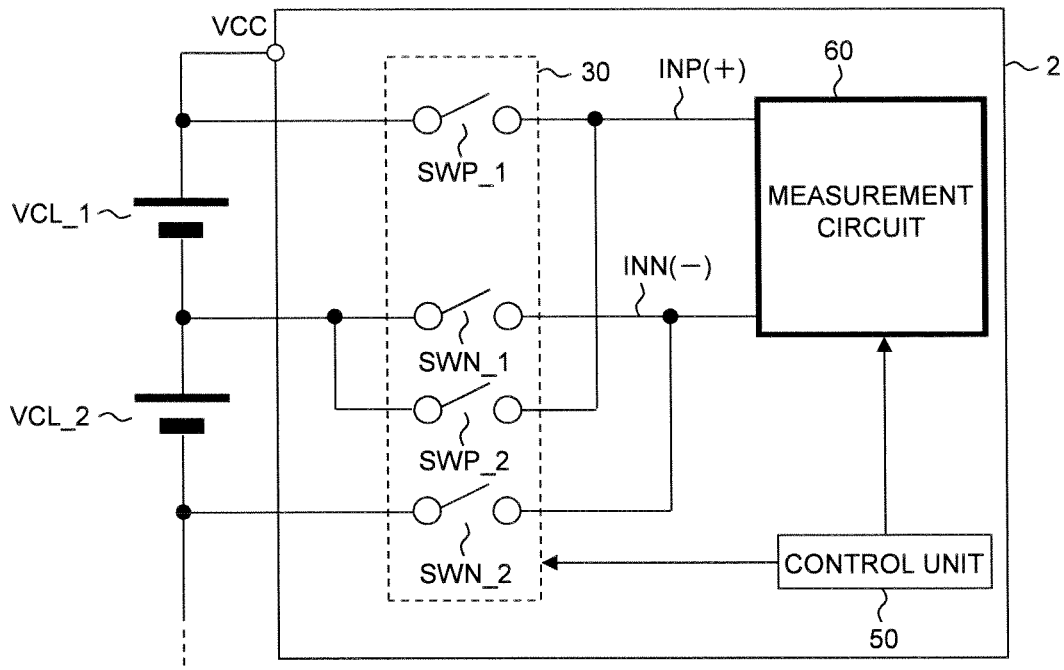
FIG. 3 is a diagram illustrating connection portions of some switch circuits of a MUX circuit 30 in the voltage measurement device 2.

FIG. 3 is a diagram illustrating connection portions of some switch circuits of the MUX circuit 30 in the voltage measurement device 2.

Figure 4:
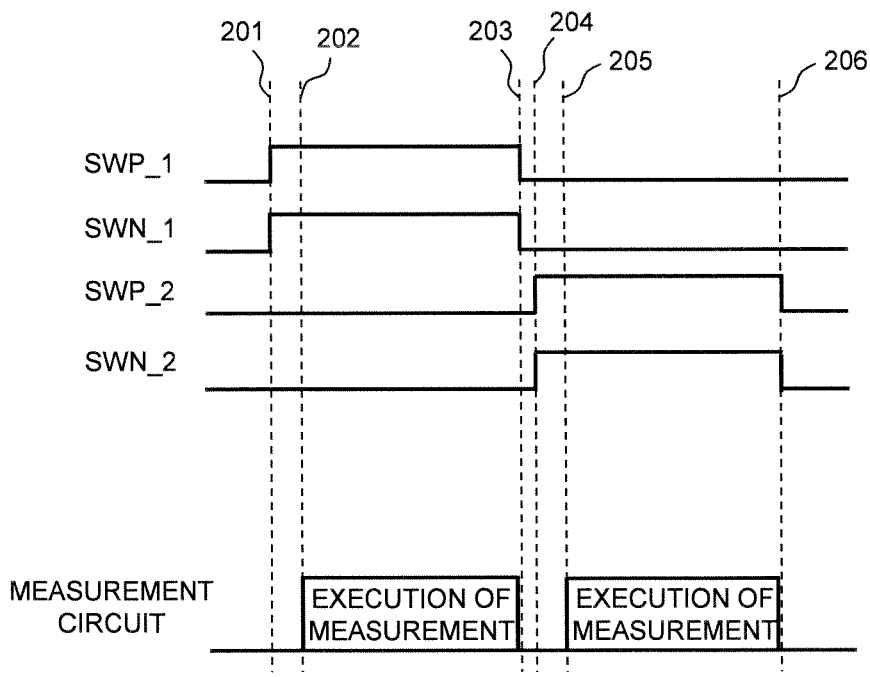
FIG. 4 is a timing chart illustrating an example of an operation timing of the voltage measurement device 2.

FIG. 4 is a timing chart illustrating an example of an operation timing of the voltage measurement device 2.

In FIG. 4, for example, in order to measure a voltage of the battery cell VCL_1, the control unit 50 first controls the MUX circuit 30 to turn on the switch circuits SWP_1 and SWN_1 at a timing of reference numeral 201. Thus, the voltage of the battery cell VCL_1 is input to the measurement circuit 60. After the input voltage is stabilized, the control unit 50 controls the measurement circuit 60 to perform voltage measurement at a timing of reference numeral 202. When the measurement of the voltage of the battery cell VCL_1 is completed, the control unit 50 controls turn-off of the switch circuits SWP_1 and SWN_1 at a timing of reference numeral 203. Subsequently, for example, in order to measure a voltage of the battery cell VCL_2, the control unit 50 controls the MUX circuit 30 at a timing of reference numeral 204 to turn on the switch circuits SWP_2 and SWN_2. At this time, the timing 204 at which the switch is turned on is a timing after the switch circuits SWP_1 and SWN_1 are set to be in an off-state and then a predetermined time elapses, in order to prevent a short circuit due to all the switch circuits SWP1 to SWN_2 being turned on. The voltage of the battery cell VCL_2 is input to the measurement circuit 60 by the switch circuits SWP_2 and SWN_2 being turned on. After the input voltage is stabilized, the control unit 50 controls the measurement circuit 60 at a timing of reference numeral 205 to perform voltage measurement. When the measurement of the voltage of the battery cell VCL_2 is completed, the control unit 50 controls the switch circuits SWP_2 and SWN_2 to be turned off at a timing of reference numeral 206. Voltages of all the plurality of battery cells connected to each other in series are measured by repeatedly performing the above-mentioned operations. In this manner, in the voltage measurement device 2 according to the first embodiment, since potentials of the plurality of battery cells connected to each other in series are directly input to the measurement circuit 60, the capacitor 602 within the measurement circuit 60 is required to be set to a high withstand voltage element as described above. However, a flying capacitor in the case where the voltage measurement device is a flying capacitor type voltage measurement device, or an OP amplifier as a buffer is not required, and thus a device-induced measurement error due to a parasitic capacitance of a switch element of a switch circuit or a measurement error due to an offset voltage of an OP amplifier or the like never occurs.

As a switch circuit constituting the MUX circuit 30, there are two types of switch circuits, that is, a switch circuit using a P-type MOS transistor as a switch element and a switch circuit using an N-type MOS transistor as a switch element. Hereinafter, each switch circuit will be described in detail.

Figure 5:
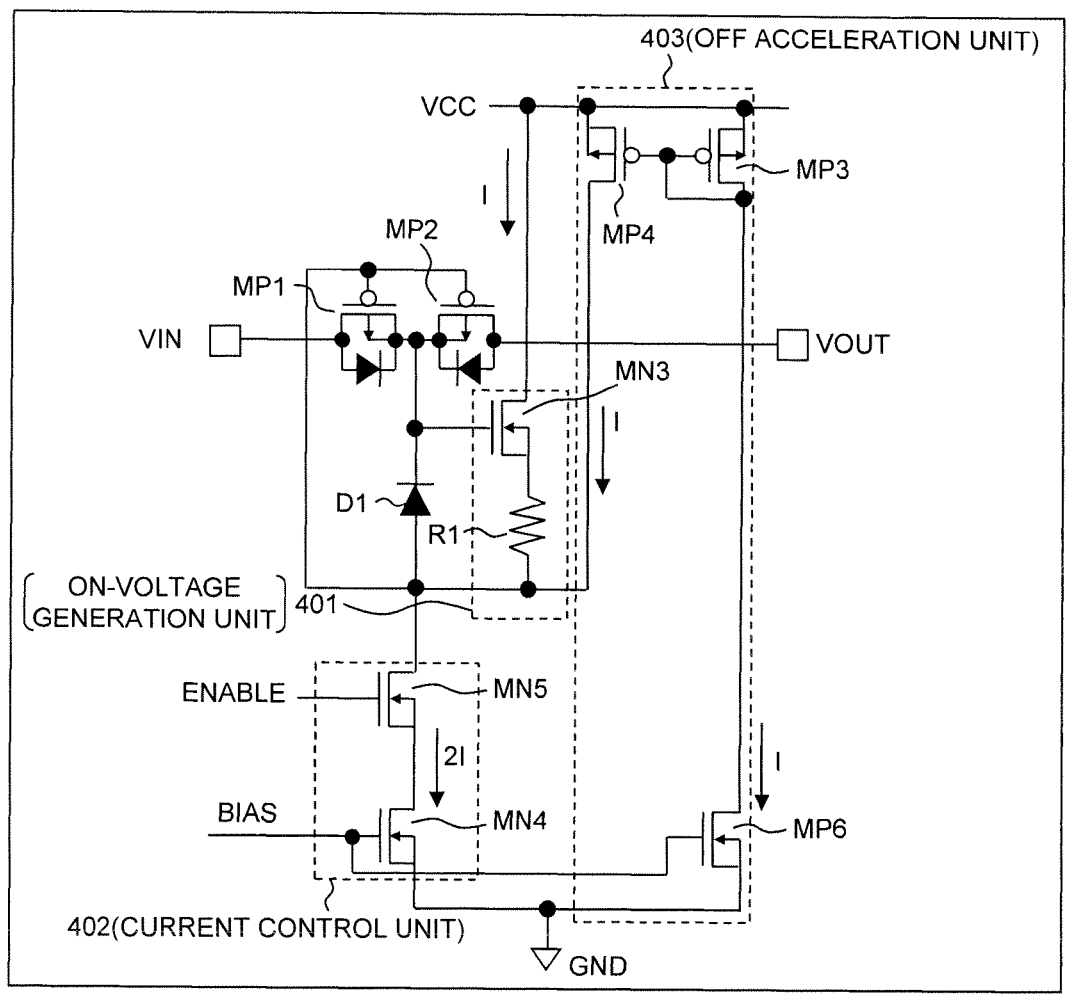
FIG. 5 is a circuit diagram illustrating an example of a switch circuit in which a P-type MOS transistor of the MUX circuit 30 is used as a switch element.

FIG. 5 is a circuit diagram illustrating an example of a switch circuit in which a P-type MOS transistor of the MUX circuit 30 is used as a switch element. As illustrated in FIG. 5, the switch circuit has a bidirectional switch element constituted by two P-type MOS transistors MP1 and MP2. Source terminals of the MP1 and the MP2 are connected in common with each other, and gate terminals thereof are also connected in common with each other. A drain terminal of the MP1 is connected to an input terminal VIN of the battery voltage input terminal side, and a drain terminal of the MP2 is connected to an output terminal VOUT of the signal output side of the MUX circuit. In addition, a diode D1 is inserted between the common source terminal and gate terminal, and an anode and a cathode are respectively connected to the common gate terminal side and the common source terminal side. Meanwhile, when a gate withstand voltage is required to be protected, a zener diode having a breakdown voltage equal to or greater than an on-voltage of the bidirectional switch element may be used instead of the diode D1.

The switch circuit further includes an on-voltage generation unit 401, a current control unit 402, and an off acceleration unit 403.

The on-voltage generation unit 401 is a source follower circuit that is constituted by an N-type MOS transistor MN3 and a resistor R1 which is a voltage generation element. A gate terminal of the MN3 is connected to the common source terminal of the bidirectional switch element, a drain terminal thereof is connected to the power supply terminal VCC having the highest level of potential, and a source terminal thereof is connected to the common gate terminal of the bidirectional switch element through the resistor R1. Meanwhile, any of elements other than a resistor may be used as the voltage generation element. For example, a MOS transistor having a gate terminal to which a bias voltage is applied may be used instead of the resistive element R1, and a depression type MOS transistor may be used as a current source. Meanwhile, the term "depression type MOS transistor" herein refers to, for example, a MOS transistor in which a threshold value is adjusted so as to generate a current even when a potential difference between a gate and a source is 0 V. In addition, a resistive element may be serially inserted into each of the gate terminals and each of the drain terminals of the MN3 and the bidirectional switch elements MP1 and MP2 in order to prevent an electrostatic discharge failure.

For example, the current control unit 402 is configured such that an N-type MOS transistor MN4 to which a bias voltage (BIAS) is applied and which supplies a current (2I) and an N-type MOS transistor MN5 to which an enable signal (ENABLE) for controlling turn-on and turn-off of the bidirectional switch elements MP1 and MP2 is applied are connected to a cascode. A drain terminal of the MN4 is connected to the gate terminals of the bidirectional switch elements MP1 and MP2. The enable signal is a control signal supplied from the control unit 50. Meanwhile, a connection relationship between the MN4 and the MN5 may be reversed. In addition, the MN4 and MN6 for supplying a current are constituted by, for example, a current mirror circuit, but may be constituted by a cascode type current mirror circuit in order to suppress a variation in a current value due to a channel length modulation effect. Similarly, the current mirror circuit constituted by the MP3 and the MP4 may be used as a cascode type current mirror circuit.

The off acceleration unit 403 includes an N-type MOS transistor MN6 to which a bias voltage (BIAS) is applied in common with the MN4 and which supplies a current (I), and P-type MOS transistors MP3 and MP4 constituting a current mirror circuit that turns back the current (I) of the MN6 and supplies the current to the gate terminal of the bidirectional switch element.

When the enable signal is set to be in a high level and the bidirectional switch element is instructed to be turned on, the MN5 is changed to an on-state, and thus a driving current 2I is generated by the MN4. The current I is added to the driving current 2I, which flows from the off acceleration unit 403, at a junction node thereof. Thus, the differential current I is drawn from the highest level of potential (VCC) through the on-voltage generation unit 401. At this time, a potential difference VGS that is enough to turn on the MP1 and the MP2 between the gate and the source of the bidirectional switch element occurs, and thus electrical conduction between the voltage input terminal side of the battery and the output side of the MUX circuit is allowed. That is, according to the above-mentioned switch circuit, when the switch is turned on, the driving current of the switch circuit is supplied from the power supply terminal VCC rather than being supplied from the input terminal (VIN) side, and thus a voltage drop due to the driving current and the on-resistance of the bidirectional switch element does not occur, thereby allowing a measurement error to be reduced. In addition, since the power of each of the battery cells constituting an assembled battery is uniformly consumed by the driving current being supplied from the power supply terminal VCC, it is possible to prevent unbalanced power consumption between the battery cells as in the related art.

On the other hand, when the enable signal is set to be in a low level and the bidirectional switch element is instructed to be turned off, the MN5 is changed to an off-state, and thus the driving current 2I does not flow. Accordingly, a current does not flow to the on-voltage generation unit 401, and thus a potential difference is not generated between the gate and the source of the bidirectional switch elements MP1 and MP2, and the switch circuit electrically opens the voltage input terminal side of the battery and the output side of the MUX circuit. In addition, the current I flowing from the off acceleration unit 403 raises the gate terminals of the bidirectional switch elements MP1 and MP2 up to the highest level of potential (VCC), thereby allowing the off-state to be stabilized. Furthermore, the current I from the off acceleration unit 403 flows into the source terminals of the MP1 and the MP2 through the diode D1, thereby charging a parasitic capacitance connected to the source terminals and raising potentials of the source terminals up to the highest level of potential (VCC). Effects of this are as follows. As described above, voltages of both ends of a selected battery cell are input to the measurement unit 603 through the capacitor 602 in the measurement circuit 60, but charge is charged to the capacitor 602 through the switch circuit of the MUX circuit 30 from the battery cell, and thus the voltages of the battery cell are input to the measurement unit 603. At this time, when signal potentials on the drain terminal sides of the bidirectional switch elements MP1 and MP2, which are in an off-state, in the MUX circuit 30 are higher than potentials on the source terminal sides thereof, a current flows through parasitic diodes of the bidirectional switch elements MP1 and MP2, which are in an off-state, other than a current flowing into the capacitor 602 from the battery cell to be measured. Accordingly, a charging time increases due to a decrease in the amount of charge charged in the capacitor 602, and thus there is a concern that voltage measurement may be started prior to the achievement of a target voltage, which results in a measurement error. In order to prevent this, there is a method of delaying a timing at which the measurement is started, but this method may increase the total measurement time of the voltage measurement. Consequently, according to the off acceleration unit 403, since the signal potentials on the drain terminal sides of the bidirectional switch elements MP1 and MP2 are prevented from becoming higher than the potentials on the source terminal sides thereof, it is possible to prevent charge from moving through the parasitic diodes, to further stabilize the off-state, and to suppress the occurrence of the measurement error.

Meanwhile, current values of the driving current (2I) and the current (I) supplied from the off acceleration unit do not necessarily have to be designed at a constant ratio, and may be set to arbitrary current values as long as it is possible to generate the difference voltage VGS for turning on the bidirectional switch element by the on-voltage generation unit 401.

Figure 6:
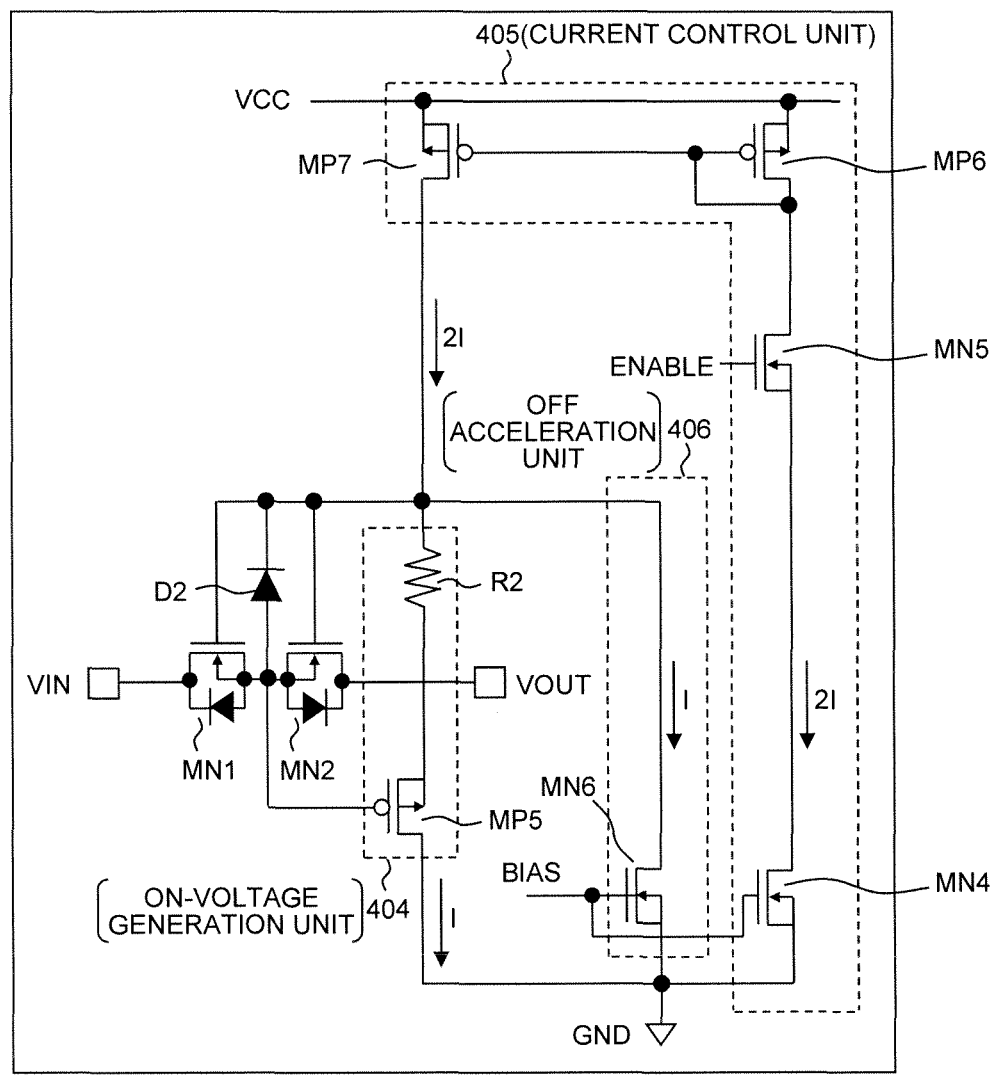
FIG. 6 is a circuit diagram illustrating an example of a switch circuit in which an N-type MOS transistor of the MUX circuit 30 is used as a switch element.

FIG. 6 is a circuit diagram illustrating an example of a switch circuit in which an N-type MOS transistor of the MUX circuit 30 is used as a switch element. As illustrated in FIG. 6, the switch circuit includes a bidirectional switch element constituted by two N-type MOS transistors MN1 and MN2. Source terminals of the MN1 and the MN2 are connected in common with each other, and gate terminals thereof are connected in common with each other. A drain terminal of the MN1 is connected to an input terminal VIN on the battery voltage input terminal side, and a drain terminal of the MN2 is connected to an output terminal VOUT on the signal output side of the MUX circuit. In addition, a diode D2 is inserted between the common source terminal and the common gate terminal, and an anode and a cathode are respectively connected to the common source terminal side and the common gate terminal side. Meanwhile, when a gate withstand voltage is required to be protected, a zener diode having a breakdown voltage equal to or greater than an on-voltage of the bidirectional switch element may be used instead of the diode D2.

The switch circuit constituted by the N-type bidirectional switch element further includes an on-voltage generation unit 404, a current control unit 405, and an off acceleration unit 406.

The on-voltage generation unit 404 is a source follower circuit that is constituted by a P-type MOS transistor MP5 and a resistor R2 which is a voltage generation element. A gate terminal of the MP5 is connected to the common source terminal of the bidirectional switch element, a drain terminal thereof is connected to the power supply terminal GND having the lowest level of potential, and a source terminal thereof is connected to the common gate terminal of the bidirectional switch element through the resistor R2. Meanwhile, similarly to the on-voltage generation unit 401, any of elements other than a resistor may be used as the voltage generation element. In addition, a resistive element may be serially inserted into each of the gate terminals and each of the drain terminals of the MP5 and the bidirectional switch elements MN1 and MN2 in order to prevent an electrostatic discharge failure.

For example, the current control unit 405 includes an N-type MOS transistor MN4 to which a bias voltage (BIAS) is applied and which supplies a current (2I), an N-type MOS transistor MN4 to which an enable signal (ENABLE) for controlling turn-on and turn-off of the bidirectional switch elements MP1 and MP2 is applied, and P-type MOS transistors MP6 and MP7 constituting a current mirror circuit for turning back the current (2I) of the MN4 and supplying the current to the gate terminal of the bidirectional switch element. As described above, the enable signal is a control signal supplied from the control unit 50. Meanwhile, when the gate terminals of the MN1 and the MN2 which constitute the bidirectional switch element can sufficiently switch the on/off state even when a low voltage is applied to the gate terminals, a signal may be directly applied to the gate terminals of the bidirectional switch element so as to drive the gate terminals, without through the current mirror circuits MP6 and MP7. In addition, a connection relationship between the MN4 and the MN5 may be reversed. Furthermore, the MN4 and the MN6 for supplying a current are constituted by, for example, a current mirror circuit, but may be constituted by a cascode type current mirror circuit in order to suppress a variation in a current value due to a channel length modulation effect. Similarly, the current mirror circuit constituted by the MP6 and the MP7 may be used as a cascode type current mirror circuit.

The off acceleration unit 406 includes an N-type MOS transistor MN6 to which a bias voltage (BIAS) is applied in common with the MN4 and which generates a current (I) between the gate terminal of the bidirectional switch element and the GND terminal.

When the enable signal is set to be in a high level and the bidirectional switch element is instructed to be turned on, the MN5 is changed to an on-state, and thus a driving current 2I is generated by the MN4. The driving current 2I flows into a node to which the common gate terminal of the bidirectional switch element is connected through the current mirror circuits MP6 and MP7, and a partial current I of the driving current flow to the off acceleration unit 406. Thus, the differential current I is drawn into the highest level of potential (GND) through the on-voltage generation unit 404. At this time, a potential difference VGS that is enough to turn on the MN1 and the MN2 occurs between the gate and the source of the bidirectional switch element, and thus electrical conduction between the voltage input terminal side of the battery and the output side of the MUX circuit is allowed. That is, according to the above-mentioned switch circuit, when the switch is turned on, the driving current of the switch circuit is supplied from the power supply terminal VCC rather than being supplied from the input terminal VIN side, and thus a voltage drop due to the driving current and the on-resistance of the bidirectional switch element does not occur, thereby allowing a measurement error to be reduced. In addition, since the power of each of the battery cells constituting an assembled battery is uniformly consumed by the driving current being supplied from the power supply terminal VCC, it is possible to prevent unbalanced power consumption between the battery cells as in the related art.

On the other hand, when the enable signal is set to be in a low level and the bidirectional switch element is instructed to be turned off, the MN5 is changed to an off-state, and thus the driving current 2I does not flow. Accordingly, a current does not flow to the on-voltage generation unit 404, and thus a potential difference is not generated between the gate and the source of the bidirectional switch elements MN1 and MN2, and the switch circuit electrically opens the voltage input terminal side of the battery and the output side of the MUX circuit. Furthermore, the off acceleration unit 403 flows the current I to the GND side so as to lower the gate terminals of the bidirectional switch elements MN1 and MN2 up to the highest level of potential (GND), thereby allowing the off-state to be stabilized. Furthermore, the off acceleration unit 403 extracts charge from the source terminals of the MN1 and the MN2 through the diode D2 so as to discharge a parasitic capacitance connected to the source terminals, thereby lowering potentials of the source terminals up to the lowest level of potential (GND). Thus, a state occurs where signal potentials of the drain terminal sides of the MP1 and the MP2 are lower than potentials of the source terminal sides thereof, thereby preventing charge from moving through parasitic diodes of the MN1 and the MN2 and further stabilizing the off-state of the bidirectional switch element. Meanwhile, as described above, current values of the driving current (2I) and the current (I) supplied from the off acceleration unit do not necessarily have to be designed at a constant ratio, and may be set to arbitrary current values as long as it is possible to generate the difference voltage VGS for turning on the bidirectional switch element by the on-voltage generation unit 404.

Next, a detailed configuration of the MUX circuit 30 will be described.

Figure 7:
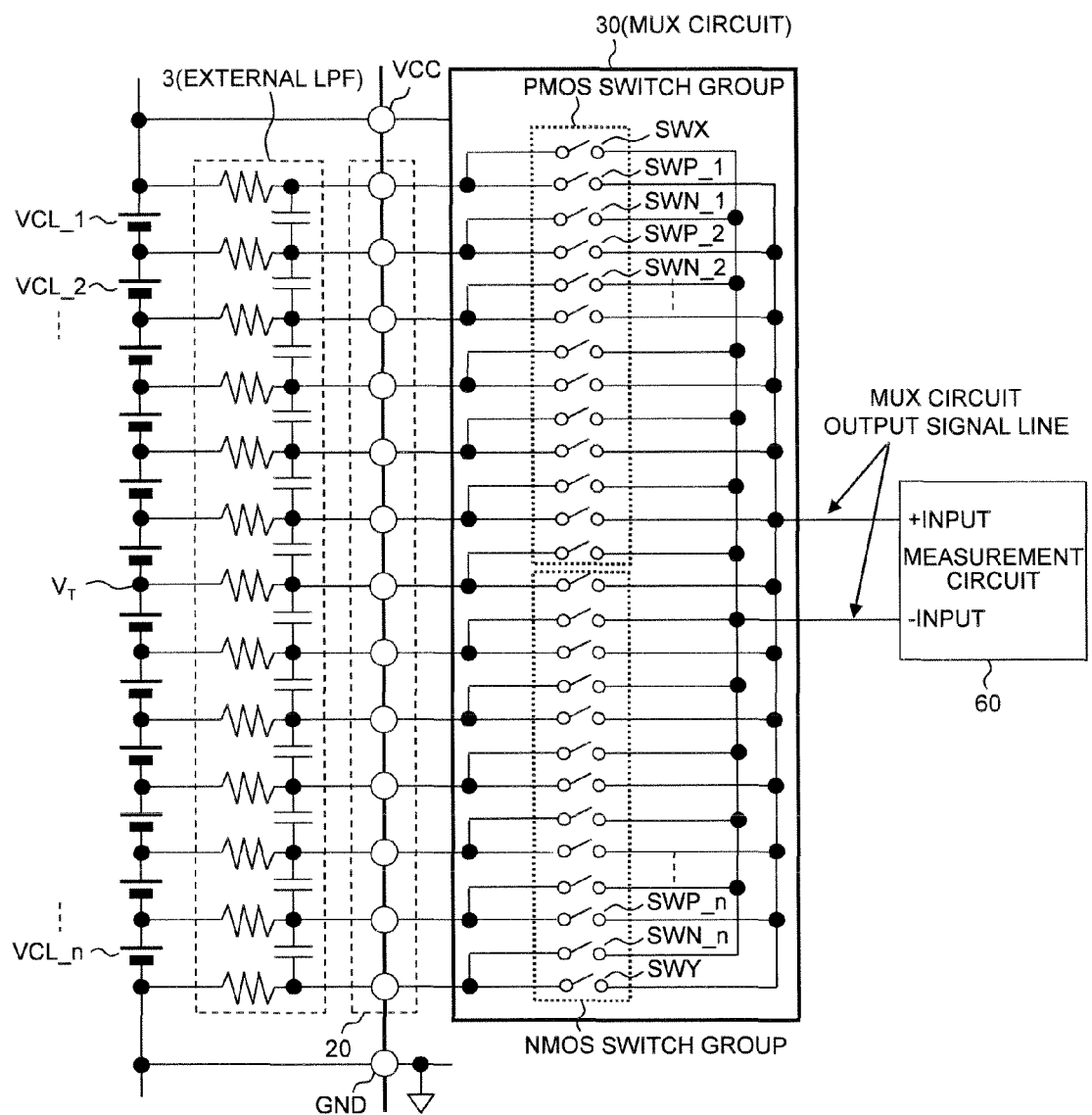
FIG. 7 is a block diagram illustrating a configuration example of the MUX circuit 30 using two types of switch circuits.

FIG. 7 is a block diagram illustrating a configuration example of the MUX circuit 30 using two types of switch circuits. For the purpose of simplification, FIG. 7 shows a connection relationship up to a former stage of the measurement circuit 60, and shows, for example, a connection relationship between a plurality of battery cells (external voltage sources) 1 which are connected to each other in series, the voltage input terminal 20, the MUX circuit 30, and the measurement circuit 60. Meanwhile, FIG. 7 shows an example of a case where a low-pass filter (LPF) 3 is inserted between the plurality of battery cells VCL and the voltage input terminal 20 in order to remove noise. For example, the low-pass filter 3 is constituted by an external resistor and a capacitor, but may be constituted using an inductor or the like. In the MUX circuit 30 illustrated in FIG. 7, for example, the switch circuit is configured as follows.

First, as a switch circuit connected to the plurality of battery cells that are consecutive from the battery cell having a potential of a negative electrode being equal to or greater than a predetermined potential (VT) to the battery cell having a potential of a positive electrode being the highest level of potential, in the plurality of battery cells, a switch circuit including a bidirectional switch element that is configured by connecting sources of two P-channel type MOSFETs in common with each other is used (a PMOS switch group). For example, in the case of a switch circuit of a P-type switch element, a voltage range is required in a direction in which gate voltages of the MP1 and the MP2 become lower than source voltages thereof in order to turn on the bidirectional switch elements MP1 and MP2. Consequently, the switch circuit of the P-type switch element is used as a switch circuit connected to the battery cell having a relatively high potential.

Secondly, as a switch circuit connected to the plurality of battery cells that are consecutive from the battery cell having a potential of a positive electrode being equal to or less than a predetermined potential (VT) to the battery cell having a potential of a negative electrode being the lowest level of potential, in the plurality of battery cells, a switch circuit including a bidirectional switch element that is configured by connecting sources of two N-channel type MOSFETs in common with each other is used (an NMOS switch group). For example, in the case of a switch circuit of an N-type switch element, a voltage range is required in a direction in which gate voltages of the MN1 and the MN2 become higher than source voltages thereof in order to turn on the bidirectional switch elements MN1 and MN2. Consequently, the switch circuit of the N-type switch element is used as a switch circuit connected to the battery cell having a relatively low potential.

Thirdly, the types of switch elements of switch circuits SWP_1 to SWP_n for connecting the positive electrode of the battery cell and a positive output (a positive input terminal INP of the measurement circuit 60) of an output signal line of the MUX circuit 30 and the types of switch elements of switch circuits SWN_1 to SWN_n for connecting the negative electrode of the battery cell and a negative output (a negative input terminal INN of the measurement circuit 60) of the output signal line of the MUX circuit 30 are made the same as each other. That is, the types of the MOS transistors of the switch elements, which form the positive signal line and the negative signal path for inputting a voltage of the selected battery cell to the measurement circuit 60, are made the same as each other, thereby allowing on-resistances of the switch circuits to be equal to each other. Thus, the switch elements are configured in such a manner that a difference in resistance components between the signal paths is decreased. Therefore, for example, in the measurement execution period illustrated in FIG. 4, even when in-phase noise due to disturbance occurs in the signal path, it is possible to prevent differential noise from being generated in the input of the measurement circuit 60 and to suppress the occurrence of a measurement error.

As described above, in the MUX circuit 30, as a switch circuit connected to the plurality of battery cells that are consecutive from the battery cell having a potential of a negative electrode being equal to or greater than a predetermined potential (VT) to the battery cell having a potential of a positive electrode being the highest level of potential, a switch circuit using a P-type MOS transistor as a switch element is used. In addition, as a switch circuit connected to the plurality of battery cells that are consecutive from the battery cell having a potential of a positive electrode being equal to or less than the predetermined potential (VT) to the battery cell having a potential of a negative electrode being the lowest level of potential, a switch circuit using an N-type MOS transistor as a switch element is used. Meanwhile, the predetermined potential VT is determined according to an input voltage range of the MUX circuit 30, characteristics of the bidirectional switch element or the like, required specifications of the MUX circuit 30, and the like.

Figure 8:
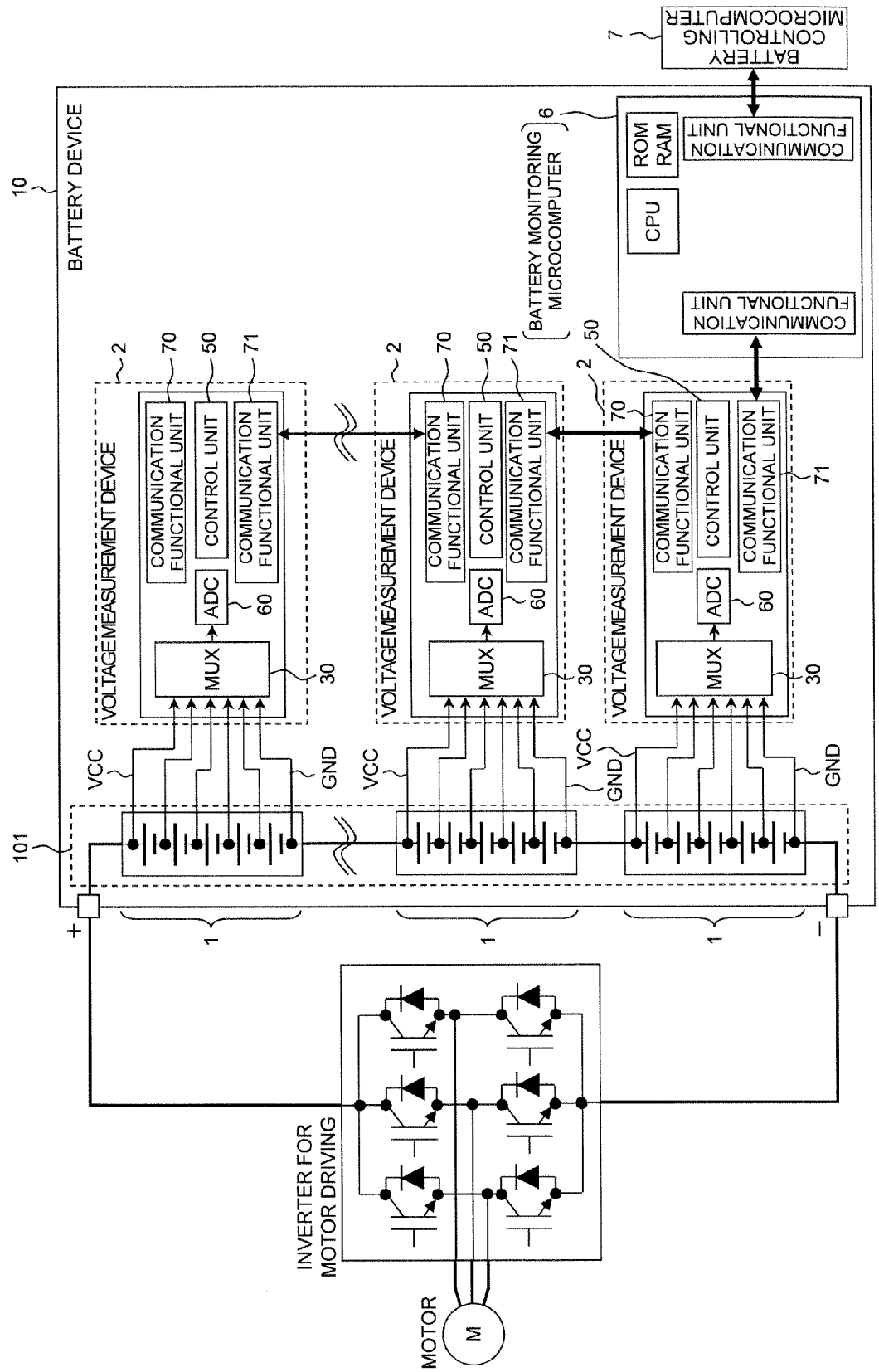
FIG. 8 is a block diagram illustrating an example of a voltage measurement system of a battery for an EV or an HEV.
Figure 9:
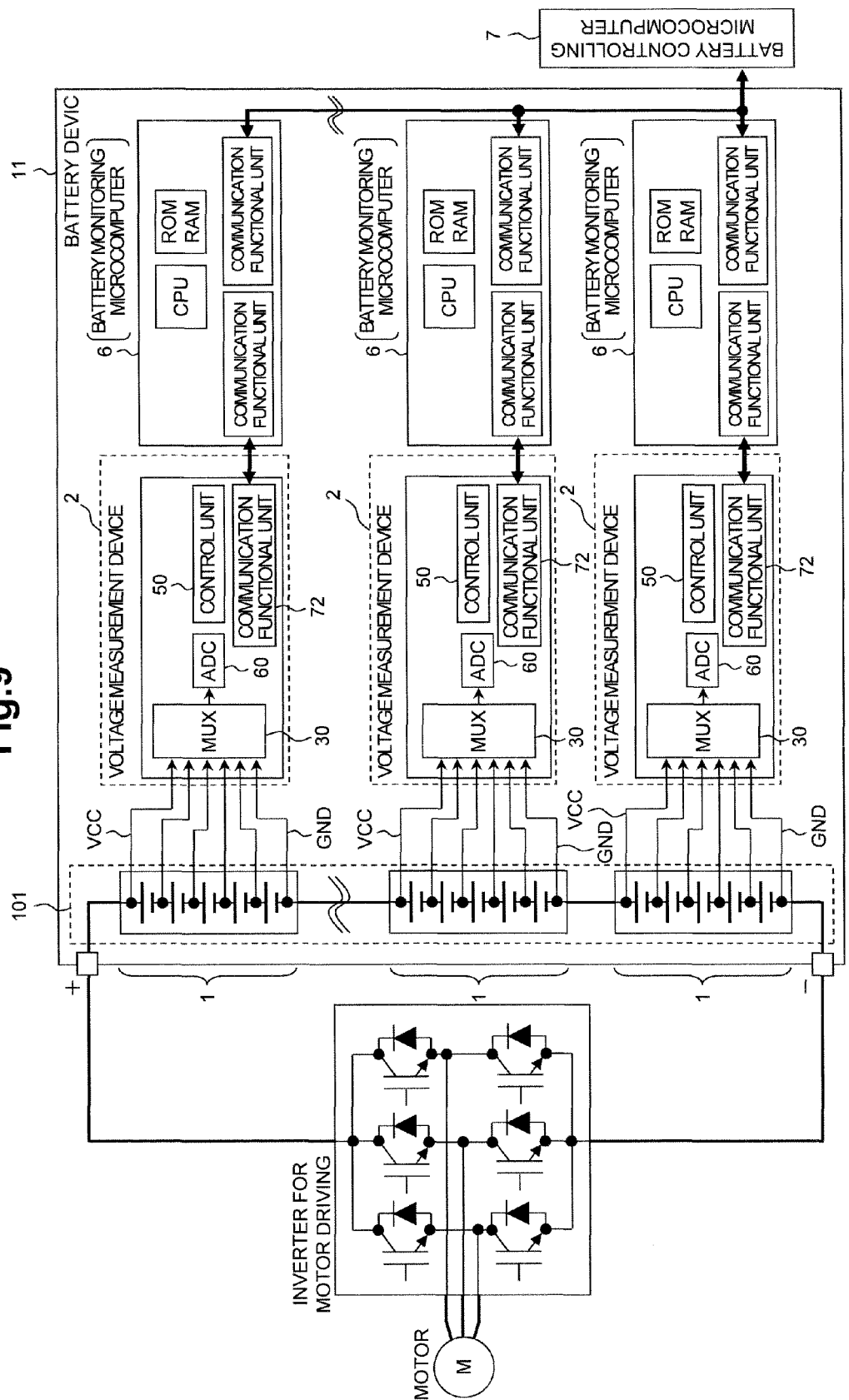
FIG. 9 is a block diagram illustrating another example of the voltage measurement system of a battery for an EV or an HEV.

An example of a system to which the voltage measurement device 2 is applied is illustrated in FIG. 8 and FIG. 9.

FIG. 8 is a block diagram illustrating an example of a voltage measurement system of a battery for an EV or an HEV.

In FIG. 8, a motor is driven by supplying power to both ends of an inverter for motor driving from a battery. A battery device 10 constituting the voltage measurement system illustrated in FIG. 8 includes a battery 101 constituted by an assembled battery in which a plurality of unit cells are connected to each other in series, a plurality of voltage measurement devices 2 that are allocated to one set of battery cells when several to several tens of battery cells among battery cells constituting the battery are assumed to be one set, and a battery monitoring microcomputer (MCU) 6. The battery 101 is constituted by several hundreds of unit cells in the whole vehicle of, for example, an electric vehicle, and the highest level of voltage is, for example, approximately 400 V. In addition, the unit cells constituting the battery 101 are, for example, lithium-ion batteries.

The battery monitoring microcomputer (MCU) 6 controls the voltage measurement device 2 to measure a battery voltage, and controls the supply of power from the battery with respect to the inverter for motor driving on the basis of a measurement result. In addition, the battery monitoring microcomputer (MCU) performs a CAN communication or the like with a Battery controlling microcomputer 7.

Each of the voltage measurement devices 2 measures a voltage using the above-mentioned method with respect to one set of battery cells 1 to be measured among the battery 101. In addition, the voltage measurement devices 2 further include communication functional units 70 and 71 in addition to the above-mentioned functional units, and communicate a control instruction or a voltage measurement result from the battery monitoring microcomputer 6 with each other using the communication functional units 70 and 71.

FIG. 9 is a block diagram illustrating another example of the voltage measurement system of a battery for an EV or an HEV.

In a battery device 11 constituting the voltage measurement system illustrated in FIG. 9, several to several tens of battery cells among the battery cells constituting the battery 101 are assumed to be one set, and the voltage measurement device 2 and the battery monitoring microcomputer (MCU) 6 are allocated to each set of battery cells 1. Voltage measurement is performed using the same method as above, but an instruction for each voltage measurement and a voltage measurement result are exchanged between the voltage measurement device 2 corresponding to one set of battery cells 1 and the battery monitoring microcomputer 6. For example, the voltage measurement device 2 of each set of battery cells 1 and the battery monitoring microcomputer 6 may be LSIs that are respectively formed in different semiconductor substrates, or may be a one-chip LSI that is formed in one semiconductor substrate.

According to the above-mentioned voltage measurement device 2 of the first embodiment, when a switch is turned on, a voltage drop based on a driving current and resistance components such as an on-resistance of the switch element in the signal path does not occur, and thus a measurement error can be reduced. In addition, since the driving current is supplied from the power supply terminal VCC, unbalanced power consumption between the unit cells can be prevented. Furthermore, it is possible to further stabilize an off-state of the bidirectional switch element by the off acceleration units 403 and 406. In addition, since the voltage measurement device 2 according to the first embodiment does not employ a flying capacitor type, the capacitor 602 within the measurement circuit 60 is required to be set to a high withstand voltage element. However, since a device-induced measurement error due to a parasitic capacitance of the switch element of the switch circuit or a measurement error due to an offset voltage of an OP amplifier or the like never occurs, a voltage measuring circuit having less measurement error can be realized.

(Second Embodiment)

Figure 10:
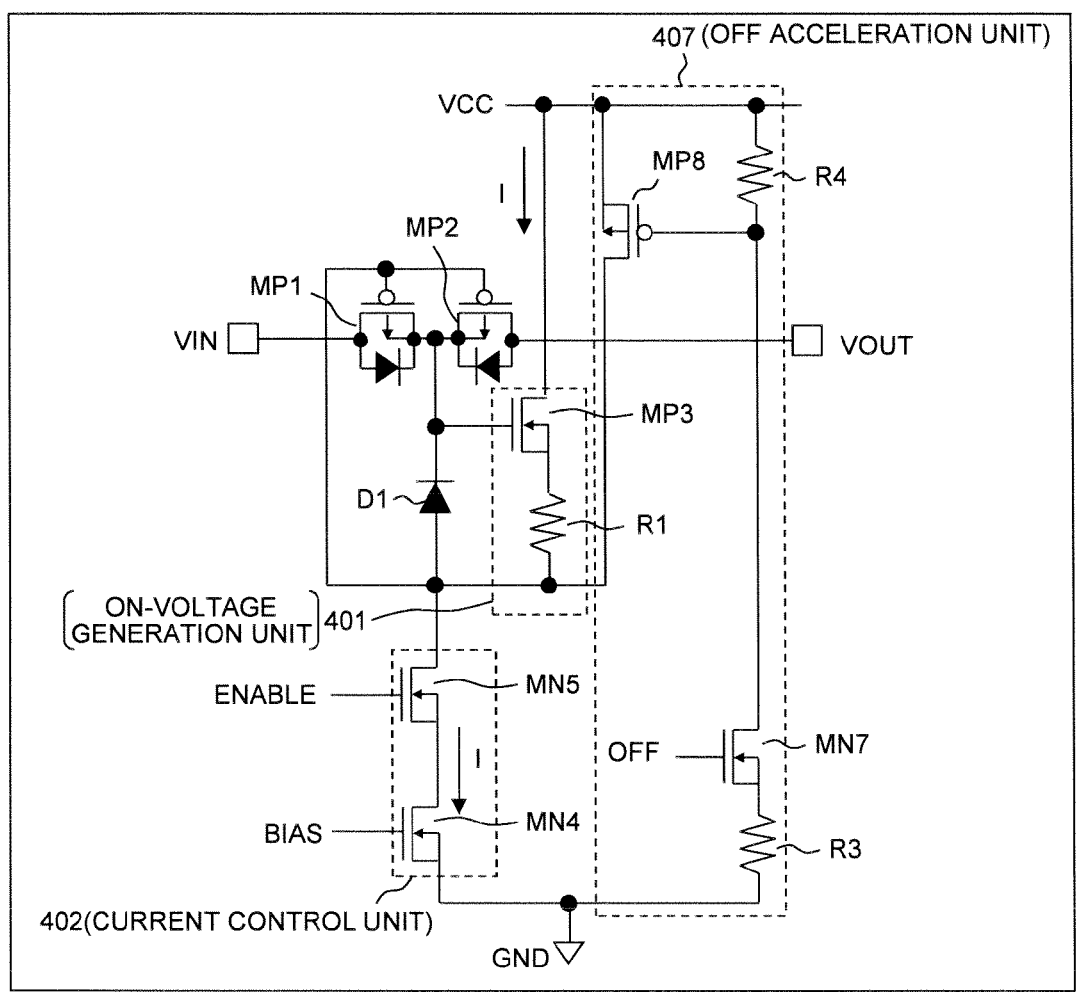
FIG. 10 is a circuit diagram illustrating another example of the switch circuit using a bidirectional switch element of the P-type MOS transistor.

FIG. 10 is a circuit diagram illustrating another example of the switch circuit using a bidirectional switch element of the P-type MOS transistor. The same components as the switch circuit of FIG. 5 are denoted by the same reference numerals and signs, and a detailed description thereof will not be repeated.

The switch circuit illustrated in FIG. 10 includes the off acceleration unit 407 that is controlled by an off signal (OFF) based on an enable signal (ENABLE), instead of the off acceleration unit 403 that is configured to flow a constant current I. The off acceleration unit 407 includes an N-type MOS transistor MN7 having a gate terminal to which an off signal (OFF) is input, a resistive element R3 that is provided between a source terminal of the MN7 and a GND terminal and adjusts a current value, a resistive element R4 that converts a current flowing to the MN7 into a voltage based on a power supply VCC, and a P-type MOS transistor MP8 that inputs the voltage generated by the resistive element R4 to connect the power supply terminal VCC and a common gate terminal of the bidirectional switch element in a switch manner.

Figure 11:
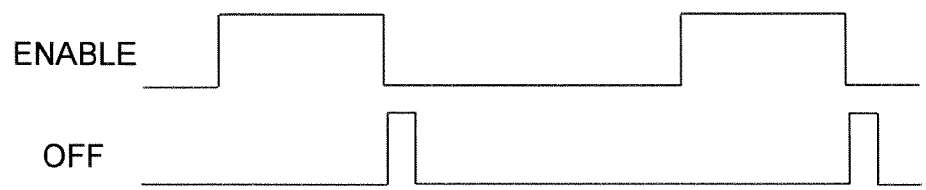
FIG. 11 is a diagram illustrating an off signal (OFF) in FIG. 10.

FIG. 11 is a diagram illustrating the off signal in FIG. 10. As illustrated in FIG. 11, the off signal (OFF) is a signal that is changed to a high state by a predetermined period after the enable signal (ENABLE) is switched from a high state to a low state. Similarly to the enable signal, for example, the off signal is one of control signals that are output from the control unit 50. In the off acceleration unit 407, when the off signal is applied once or a plurality of times as a brief pulse during a period in which the enable signal (ENABLE) is switched to a low state, the MN7 is turned on to thereby generate a voltage based on the power supply VCC by the resistor R4. Accordingly, the MP8 is turned on, and thus a large current instantaneously flows into the gate terminals of the bidirectional switch elements MP1 and MP2 from the power supply VCC side. Thus, the gate terminal of the bidirectional switch element is raised to the highest level of potential, and the source terminal of the bidirectional switch element is also raised to the highest level of potential by the flow of a current through a diode D1. Based on the above operation, it is possible to prevent a potential of the drain terminal side of the bidirectional switch element from becoming higher than a potential of the source terminal side thereof and to further stabilize an off-state of the bidirectional switch element. In addition, it is possible to perform transition to a stabilized state more rapidly than in a case of charging with a constant current.

In addition, unlike the switch circuit of FIG. 5, a bias current I is not flowed when the switch element is turned on. Thus, an on-voltage of the switch element is determined on the basis of a resistor R1 and a current I which flows to the MN4. That is, since the bias current I for off acceleration is not required to be considered in determining the on-voltage of the bidirectional switch element, it is possible to facilitate a design and to increase the accuracy of the on-voltage. In addition, since the bias current I is not wastefully flowed, the current consumption can also be further suppressed.

Meanwhile, a current is generated by the MN7 for inputting an off signal and a resistor R3, but is not limited to the configuration of FIG. 10. A configuration may also be made such that the MN7 is operated as a bias current source at the time of the application of the off signal by adjusting a voltage of the off signal. In addition, a MOS transistor having a gate terminal to which a bias voltage is applied may be used instead of the resistive element R3, or a depression type MOS transistor may be used as a current source. Meanwhile, the term "depression type MOS transistor" herein refers to, for example, a MOS transistor in which a threshold value is adjusted so as to generate a current even when a potential difference between a gate and a source is 0 V.

(Third Embodiment)

Figure 12:
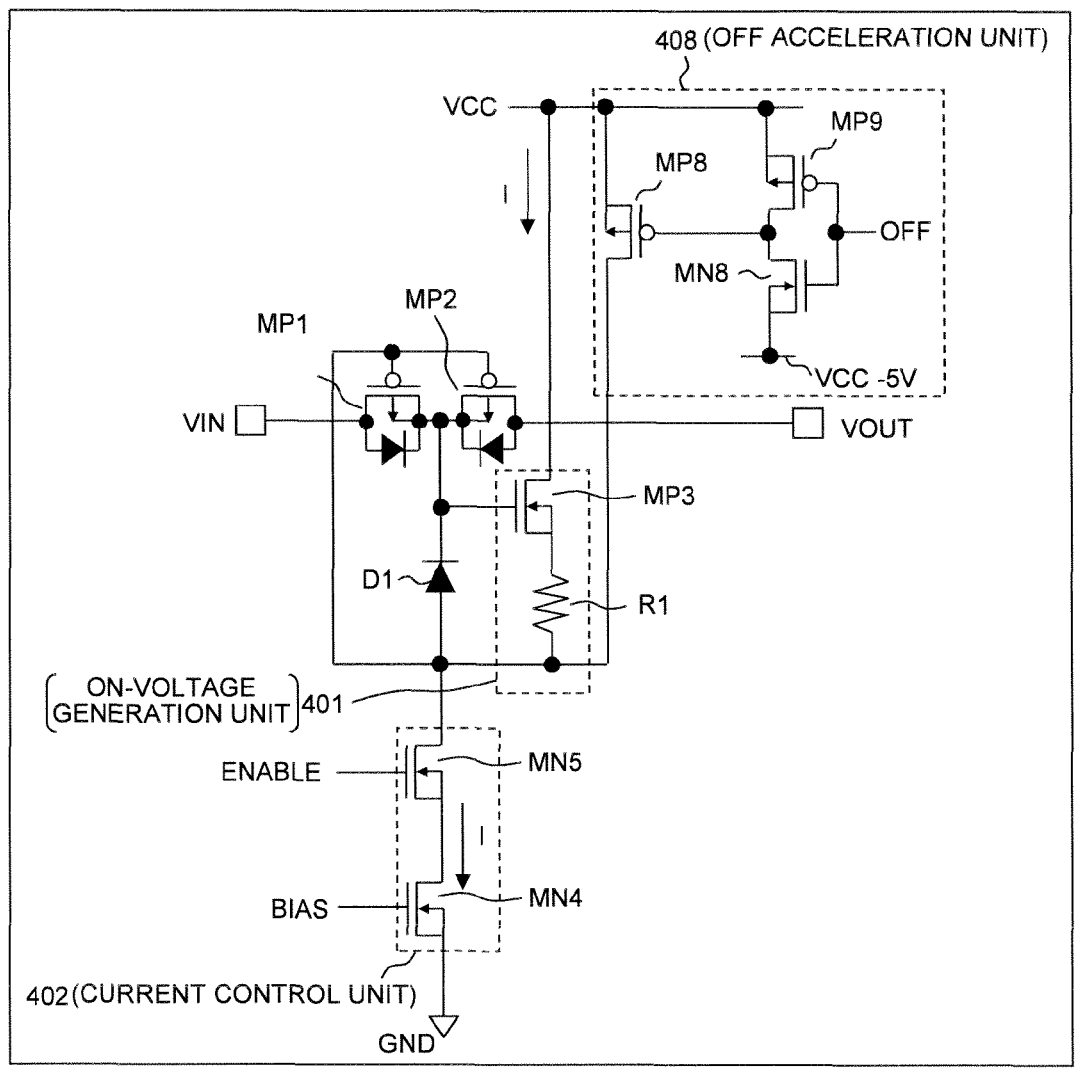
FIG. 12 is a circuit diagram illustrating another example of the switch circuit using the bidirectional switch element of the P-type MOS transistor.

FIG. 12 is a circuit diagram illustrating another example of the switch circuit using the bidirectional switch element of the P-type MOS transistor. The same components as the switch circuits of FIG. 5 and FIG. 10 are denoted by the same reference numerals and signs, and a detailed description thereof will not be repeated.

The switch circuit illustrated in FIG. 12 includes the off acceleration unit 408 that is controlled by an off signal (OFF) based on an enable signal (ENABLE), instead of the off acceleration unit 403 that is configured to flow a constant current I. The off acceleration unit 408 includes an N-type MOS transistor MN8 and a P-type MOS transistor MP9 which constitute a logic circuit to which the off signal (OFF) is input, and a P-type MOS transistor MP8 that inputs an output of the logic circuit to connect a power supply terminal VCC and a common gate terminal of a bidirectional switch element in a switch manner. The inverter circuit is driven between the power supply VCC and a voltage based on the power supply VCC. For example, a potential based on the power supply VCC is a potential that is generated so as to be lower by 5 V than the power supply VCC. Meanwhile, the potential based on the power supply VCC is set to a voltage that is lower by 5 V than the highest level of voltage, but this voltage can be set in accordance with terms and conditions such as a withstand voltage of an element to be used. In addition, for the purpose of simplification, FIG. 12 shows the inverter circuit which is constituted by the MN8 and the MP9, as the logic circuit, but the logic circuit may be configured as a more complex logic circuit as long as the MP8 can be controlled in response to the off signal.

Figure 13:
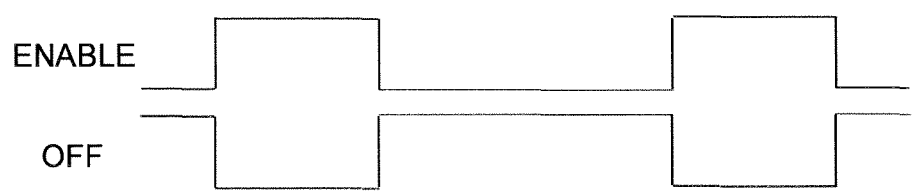
FIG. 13 is a diagram illustrating an off signal (OFF) in FIG. 12.

FIG. 13 is a diagram illustrating the off signal in FIG. 12. As illustrated in FIG. 13, for example, the off signal (OFF) is a signal that is opposite in phase to the enable signal (ENABLE), and is a signal that is changed to a high state only during a period in which the enable signal is in a low state. Similarly to the enable signal, for example, the off signal is one of control signals that are output from the control unit 50.

In the off acceleration unit 408, when an off signal that is changed to a high state is applied during a period in which the enable signal (ENABLE) is switched to a low state, the MP8 is turned on, and thus a large current instantaneously flows into the gate terminals of the bidirectional switch elements MP1 and MP2 from the power supply VCC side. Thus, the gate terminal of the bidirectional switch element is raised to the highest level of potential, and the source terminal of the bidirectional switch element is also raised to the highest level of potential by the flow of a current through a diode D1. Based on the above operation, it is possible to prevent a potential of the drain terminal side of the bidirectional switch element from becoming higher than a potential of the source terminal side thereof and to further stabilize an off-state of the bidirectional switch element. In addition, it is possible to perform transition to a stabilized state more rapidly than in a case of charging with a constant current.

In addition, similarly to the switch circuit according to the second embodiment, a bias current I is not flowed from the off acceleration circuit 408 when the switch element is turned on. Thus, since the bias current I for off acceleration is not required to be considered in determining an on-voltage of the bidirectional switch element, it is possible to facilitate a design and to increase the accuracy of the on-voltage. In addition, since the bias current I is not wastefully flowed, the current consumption can also be further suppressed.

(Fourth Embodiment)

Figure 14:
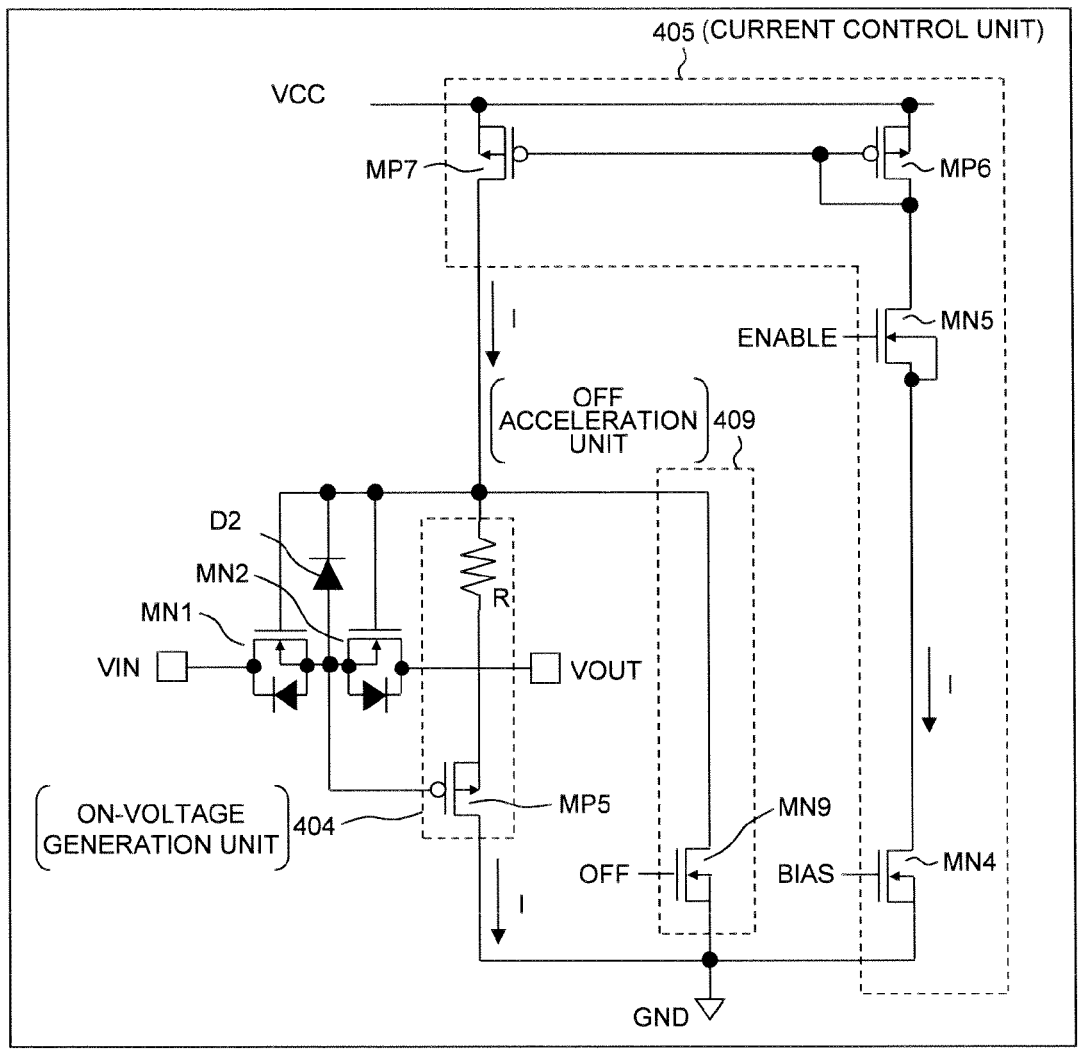
FIG. 14 is a circuit diagram illustrating another example of the switch circuit using a bidirectional switch element of the N-type MOS transistor.

FIG. 14 is a circuit diagram illustrating another example of the switch circuit using a bidirectional switch element of the N-type MOS transistor. The same components as the switch circuit of FIG. 6 are denoted by the same reference numerals and signs, and a detailed description thereof will not be repeated.

The switch circuit illustrated in FIG. 14 includes an off acceleration unit 409 that is controlled by an off signal (OFF) based on an enable signal (ENABLE), instead of the off acceleration unit 406 that is configured to flow a constant current I. The off acceleration unit 409 includes an N-type MOS transistor MN9 having a gate terminal to which an off signal (OFF) is input, a source terminal being connected with a GND terminal, and a drain terminal being connected to a common gate terminal of the bidirectional switch element.

Figure 15:
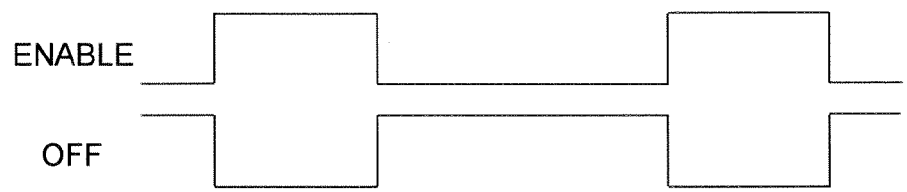
FIG. 15 is a diagram illustrating an off signal (OFF) in FIG. 14.

FIG. 15 is a diagram illustrating the off signal (OFF) in FIG. 14. As illustrated in FIG. 15, for example, the off signal (OFF) is a signal that is opposite in phase to the enable signal (ENABLE), and is a signal that is changed to a high state only during a period in which the enable signal is in a low state. Similarly to the enable signal, for example, the off signal is one of control signals that are output from the control unit 50.

In the off acceleration unit 409, when an off signal that is changed to a high state is applied during a period in which the enable signal (ENABLE) is switched to a low state, the MN9 is turned on, and thus a large current instantaneously flows into a power supply GND side from the gate terminal sides of the bidirectional switch elements MP1 and MP2. Thus, the gate terminal of the bidirectional switch element is lowered to the lowest level of potential, and the source terminal of the bidirectional switch element is also lowered to the lowest level of potential by the flow of a current through a diode D2. Based on the above operation, it is possible to prevent a potential of the drain terminal side of the bidirectional switch element from becoming lower than a potential of the source terminal side thereof and to further stabilize an off-state of the bidirectional switch element. In addition, it is possible to perform transition to a stabilized state more rapidly than in a case of charging with a constant current.

In addition, similarly to the switch circuit according to the first embodiment and the switch circuit according to the second embodiment, a bias current I is not flowed from the off acceleration circuit 409 when the switch element is turned on. Thus, since the bias current I for off acceleration is not required to be considered in determining an on-voltage of the bidirectional switch element, it is possible to facilitate a design and to increase the accuracy of the on-voltage. In addition, since the bias current I is not wastefully flowed, the current consumption can also be further suppressed.

Meanwhile, in FIG. 14, the source terminal of the MN9 is directly connected to the GND terminal, but is not limited thereto. A resistive element for adjusting a current value may be inserted between the source terminal and the GND terminal. In addition, a configuration may also be made such that the MN9 is operated as a bias current source at the time of the application of the off signal by adjusting a voltage of the off signal. Based on these configurations, a peak current at the time of discharge is degraded, thereby contributing to a reduction in system noise emission. Furthermore, the off signal is not limited to a pulse illustrated in FIG. 15, and may be a brief pulse as illustrated in FIG. 11. The pulse is not limited to once, and may be applied a plurality of times.

(Fifth Embodiment)

Figure 16:
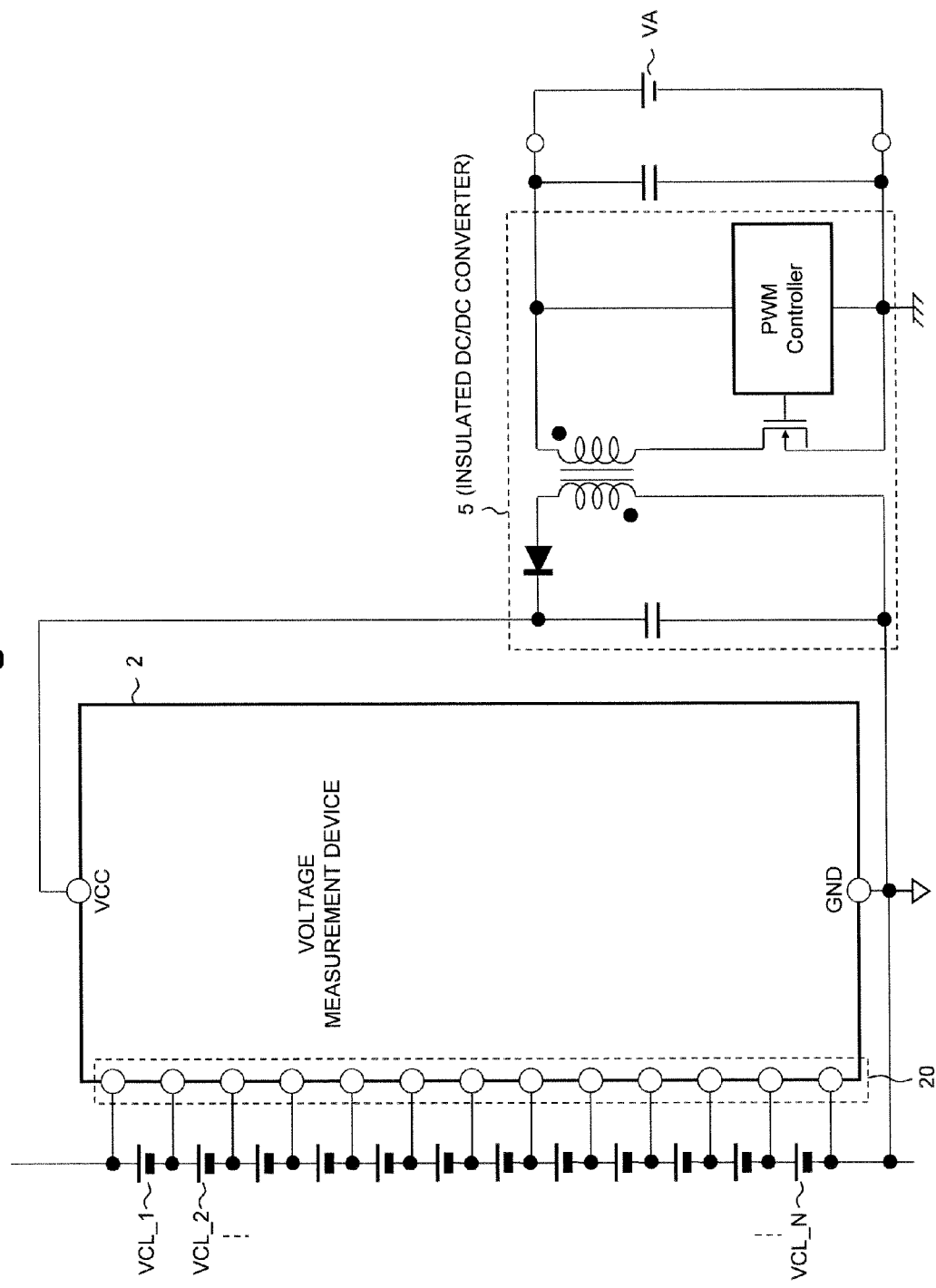
FIG. 16 is a block diagram illustrating an example of a case where the supply of power of the voltage measurement device 2 is performed from another power supply.

FIG. 16 is a block diagram illustrating an example of a case where the supply of power of the voltage measurement device 2 is performed from a different power supply.

In the first embodiment, the supply of power of voltage measurement device 2 is performed from a highest level of voltage of the plurality of battery cells VCL that are connected to each other in series. However, in a fifth embodiment, power is supplied from a power supply that is different from the plurality of battery cells. For example, when the voltage measurement device 2 is applied to a voltage measurement system of a battery for an EV or an HEV, power is supplied from a voltage VA that is generated on the basis of a lead battery power supply or the like which is mounted to drive an in-vehicle lighting or the like. As described above, since several tens or more of lithium-ion batteries, which are used as batteries, are connected to each other in series, a plurality of the voltage measurement devices 2 are used. Since the GND voltages thereof are different from each other, it is not possible to electrically directly connect a power supply circuit. Consequently, for example, energy is supplied by an electrical insulation from the voltage VA that is generated by raising or lowering a voltage of, for example, a lead battery power supply, and thus a voltage VCC obtained by raising or lowering the voltage VA is supplied to the voltage measurement device 2 by using an insulated DC/DC converter 5. FIG. 16 shows an example of a case where a power supply voltage is shared with a flyback converter, but any of other configurations may be made. In addition, the power supply voltage VCC supplies a voltage equal to or greater than the highest level of voltage of the plurality of battery cells that are connected to each other in series. For example, when a voltage of the battery cell is assumed to be up to 4.3 V with respect to the voltage measurement device in a case where twelve lithium-ion batteries are connected to each other in series, the power supply voltage VCC is required to be equal to or greater than 52 V. Consequently, an output voltage of the insulated DC/DC converter 5 is adjusted so as to supply, for example, approximately 55 V as the power supply voltage VCC.

According to this, since a driving current of the switch circuit in the MUX circuit 30 of the voltage measurement device 2 is not supplied from the plurality of battery cells connected to each other in series, it is possible to suppress the power consumption of the plurality of battery cells in a voltage measurement operation of the battery cell and to prevent a degradation in battery durability due to unbalanced battery energy consumption of the battery cell.

(Sixth Embodiment)

In the first embodiment, the voltage measurement device 2 that is configured not to use a flying capacitor is shown, but the MUX circuit 30 including the switch circuit can also be applied to the flying capacitor type voltage measurement device.

Figure 17:
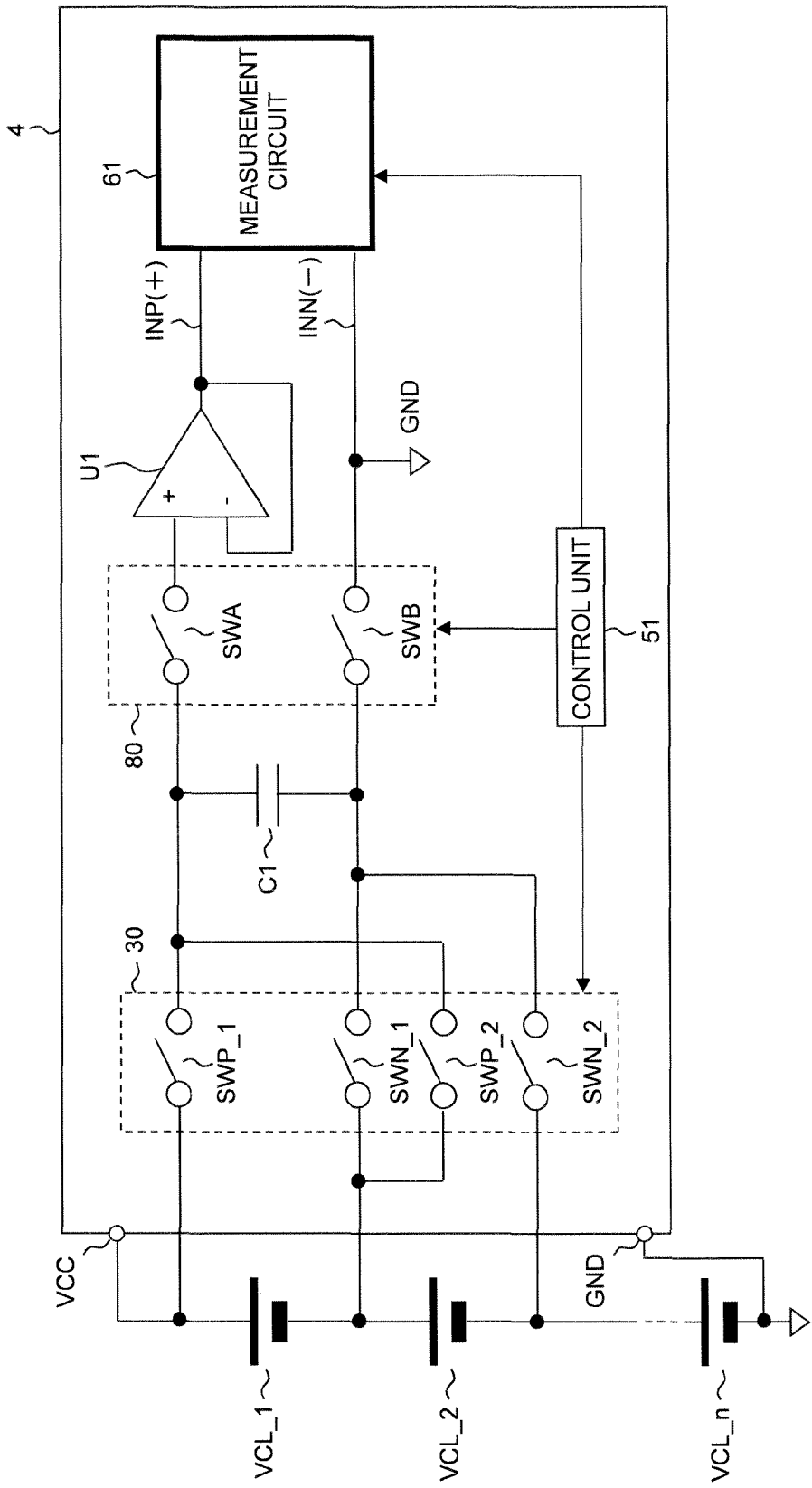
FIG. 17 is a block diagram illustrating an example of a flying capacitor type voltage measurement device to which the MUX circuit 30 is applied.

FIG. 17 is a block diagram illustrating an example of a flying capacitor type voltage measurement device to which the MUX circuit 30 is applied. A voltage measurement device 4 illustrated in FIG. 17 includes the MUX circuit 30, a flying capacitor C1, a switch unit 80 for inputting a voltage, an OP amplifier (buffer amplifier) U1 constituting a buffer, a measurement circuit 61, and a control unit 51. The measurement circuit 61 includes a delta-sigma type AD conversion circuit or a successive approximation register (SAR) type AD conversion circuit. For example, a voltage of a positive electrode of the highest level of battery cell VCL_1, among the plurality of battery cells VCL, is input to a power supply terminal VCC of the voltage measurement device 4, and a voltage of a negative electrode of the lowest level of battery cell VCL_n, among the plurality of battery cells VCL, is input to the power supply terminal GND.

An operation procedure of the flying capacitor type voltage measurement device 4 will be described below in detail with reference to FIG. 18.

Figure 18:
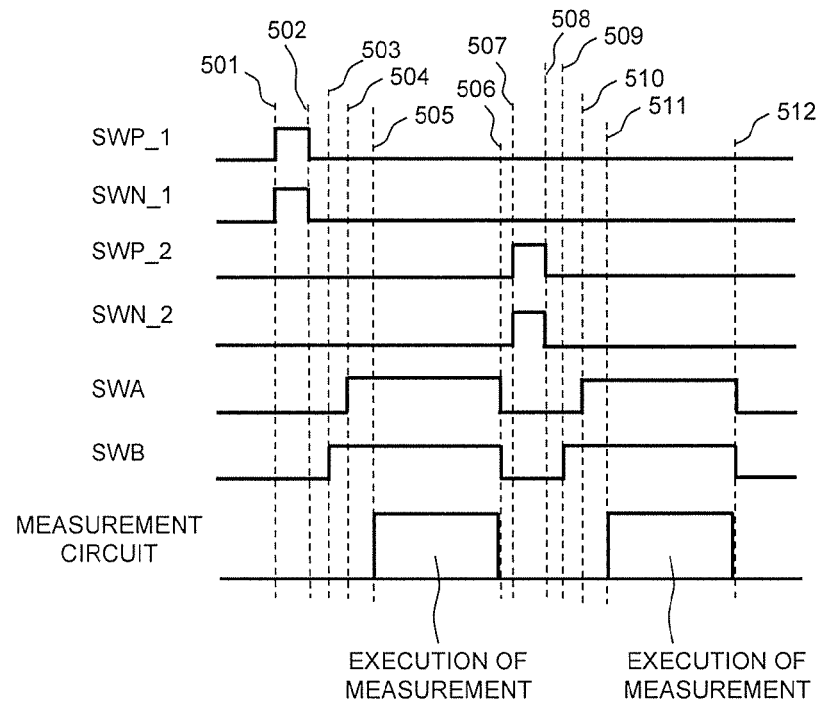
FIG. 18 is a timing chart illustrating an example of an operation timing of a voltage measurement device 4.
Figure 19:
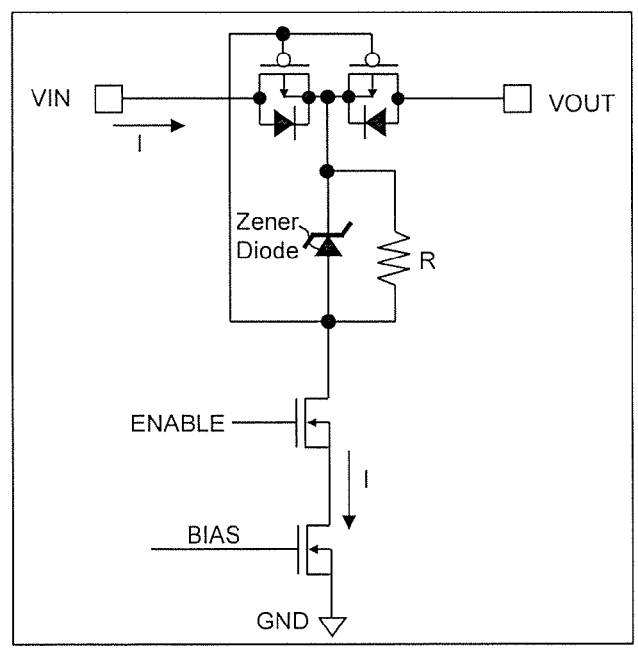
FIG. 19 is a circuit diagram of a switch circuit in which a P-type MOS transistor, which was examined by the inventor of the present application before the present invention, is used as a switch element.
Figure 20:
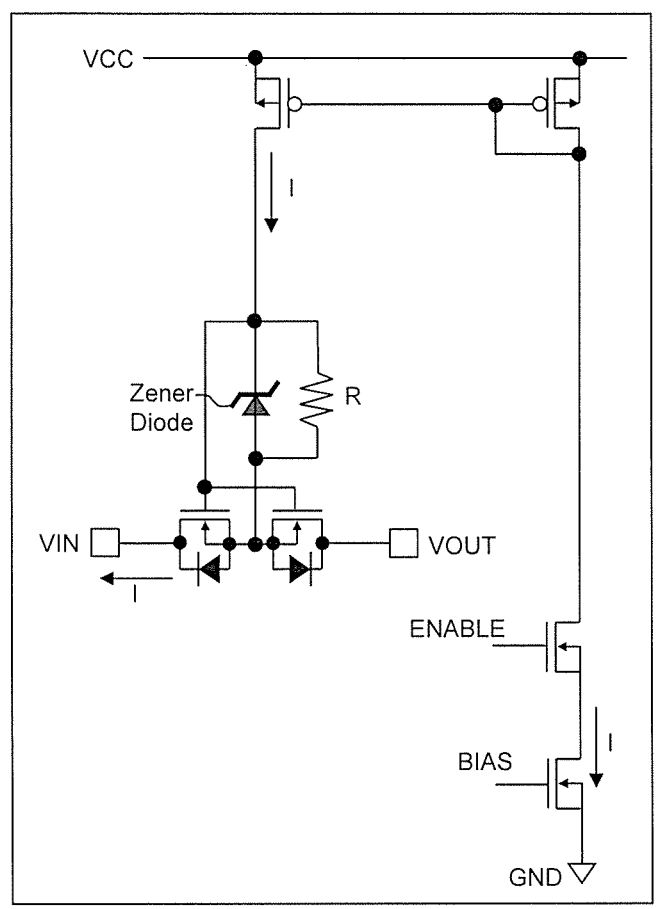
FIG. 20 is a circuit diagram of a switch circuit in which an N-type MOS transistor, which was examined by the inventor of the present application before the present invention, is used as a switch element.

FIG. 18 is a timing chart illustrating an example of an operation timing of the voltage measurement device 4 illustrated in FIG. 17.

For example, first, the control unit 51 controls the MUX circuit 30 at a timing of reference numeral 501 to turn on switch circuits SWP_1 and SWN_1 in order to measure a voltage of the battery cell VCL_1. Thus, the voltage of the battery cell VCL_1 is input to both ends of the flying capacitor C1. After the input voltage is stabilized, the control unit 51 controls the switch circuits SWP_1 and SWN_1 to be turned off at a timing of reference numeral 502 so as to set the flying capacitor C1 to be in a floating state. The control unit 51 controls a switch circuit SWB to be turned on at a timing of reference numeral 503 so as to connect one electrode of the flying capacitor C1 to a negative input terminal INN (a GND potential) of the measurement circuit 61. Thus, voltages of both ends of the flying capacitor C1 are converted into voltages based on the GND potential. Next, the control unit controls a switch circuit SWA to be turned on at a timing of reference numeral 504 so as to input the voltage of the flying capacitor C1 to the measurement circuit 60 through the buffer amplifier U1. Then, the control unit 51 controls the measurement circuit 61 at a timing of reference numeral 505 to perform voltage measurement. When the measurement of the voltage of the battery cell VCL_1 is completed, the control unit 51 controls the switch circuits SWA and SWB to be turned off at a timing of reference numeral 506. Next, the control unit 51 controls the MUX circuit 30 at a timing of reference numeral 507 to turn on the switch circuits SWP_2 and SWN_2, for example, in order to measure a voltage of a battery cell VCL_2. Thus, the voltage of the battery cell VCL_2 is input to both ends of the flying capacitor C1. After the input voltage is stabilized, the control unit 51 controls the switch circuits SWP_1 and SWN_1 to be turned off at a timing of reference numeral 508 so as to set the flying capacitor C1 to be in a floating state. The control unit 51 controls the switch circuit SWB to be turned on at a timing of reference numeral 509 so as to connect one electrode of the flying capacitor C1 to the negative input terminal INN (the GND potential) of the measurement circuit 61. Next, the control unit controls the switch circuit SWA to be turned on at a timing of reference numeral 510 so as to input a voltage of the flying capacitor C1 to the measurement circuit 61 through the buffer amplifier U1. Then, the control unit 51 controls the measurement circuit 61 at a timing of reference numeral 511 to perform voltage measurement. When the measurement of the voltage of the battery cell VCL_2 is completed, the control unit 51 controls the switch circuits SWA and SWB to be turned off at a timing of reference numeral 512. Voltages of all the battery cells of unit cells connected to each other in series are measured by repeatedly performing the above-mentioned operations.

As described above, in the case of the flying capacitor type voltage measurement device, a measurement error caused by, for example, a parasitic capacitance of a switch element with respect to a flying capacitor, or a measurement error caused by an offset voltage of an OP amplifier constituting a buffer occur. However, when such errors are negligible, the application of the flying capacitor type voltage measurement device 4 as a voltage measurement device can allow the measurement circuit 60 to be configured without using a high withstand voltage element. In addition, since the MUX circuit 30 is applied to the voltage measurement device 4, it is possible to suppress the occurrence of a measurement error due to a voltage drop based on a driving current of a switch circuit and resistance components such as an on-resistance of a signal path, to prevent an unbalanced power consumption between battery cells, and to further stabilize an off-state of a switch element.

The invention contrived by the inventor has been described in detail based on the embodiments. However, the invention is not limited thereto, and various changes may be made without departing from the scope of the invention.

For example, in the first to sixth embodiments, a case where a voltage measurement device is applied to a voltage measurement system of a battery of an electric vehicle or the like has been exemplified. However, the present invention is not limited thereto, and can also be applied to battery voltage measurement of a product using many direct batteries, such as a digital camera, a notebook PC, an electric tool, an electric assist bicycle, or an electric motorcycle. In addition, a lithium-ion battery has been exemplified as a battery cell constituting an external voltage source. However, the present invention is not limited thereto, and can also be applied to various types of batteries such as a nickel-hydrogen battery or a fuel cell. Furthermore, a case where the switch circuits according to the first to sixth embodiments are applied to the MUX circuit 30 in the voltage measurement device has been exemplified. However, the present invention is not limited thereto, and the switch circuits can also be applied to circuits for other purposes as long as the switch circuits are also used as a switch.

INDUSTRIAL APPLICABILITY

The present invention relates to a switch circuit, a selection circuit, and a voltage measurement device, and particularly, can be widely applied to a voltage measurement device that selects and measures one of a plurality of voltages.

EXPLANATION OF REFERENCE NUMERALS

VCL_1 to VCL_n: BATTERY CELL
1: ONE SET OF BATTERY CELLS
2, 4: VOLTAGE MEASUREMENT DEVICE
3: EXTERNAL LPF
20: VOLTAGE INPUT TERMINAL
30: MULTIPLEXER CIRCUIT (MUX CIRCUIT)
SWP_1 to SWP_n: SWITCH CIRCUIT FOR CONNECTING POSITIVE ELECTRODE OF BATTERY CELL AND POSITIVE INPUT TERMINAL OF MEASUREMENT CIRCUIT
SWN_1 to SWN_n: SWITCH CIRCUIT FOR CONNECTING NEGATIVE ELECTRODE OF BATTERY CELL AND NEGATIVE INPUT TERMINAL OF MEASUREMENT CIRCUIT
40: PROTECTING DIODE
50, 51: CONTROL UNIT
60, 61: MEASUREMENT CIRCUIT
INP(+): POSITIVE INPUT TERMINAL
INN(−): NEGATIVE INPUT TERMINAL
601: SWITCH UNIT
602: CAPACITOR
603: MEASUREMENT UNIT
201 to 206: OPERATION TIMING
401, 404: ON-VOLTAGE GENERATION UNIT
402, 405: CURRENT CONTROL UNIT
403, 406 to 409: OFF ACCELERATION UNIT
MP1, MP2: BIDIRECTIONAL SWITCH ELEMENT (P-TYPE MOS TRANSISTOR)
MN1, MN2: BIDIRECTIONAL SWITCH ELEMENT (N-TYPE MOS TRANSISTOR)
MN3 to MN9: N-TYPE MOS TRANSISTOR
MP3 to MP9: P-TYPE MOS TRANSISTOR
R1 to R4: RESISTIVE ELEMENT
D1, D2: DIODE
VIN: INPUT TERMINAL OF SWITCH CIRCUIT
VOUT: OUTPUT TERMINAL OF SWITCH CIRCUIT
101: BATTERY
10, 11: BATTERY DEVICE
70, 71, 72: COMMUNICATION FUNCTIONAL UNIT
5: INSULATED DC/DC CONVERTER
6: BATTERY MONITORING MICROCOMPUTER
7: BATTERY CONTROLLING MICROCOMPUTER
VA: VOLTAGE GENERATED ON THE BASIS OF LEAD BATTERY OR THE LIKE
80: SWITCH UNIT
SWA, SWB: SWITCH CIRCUIT
U1: BUFFER AMPLIFIER
501 to 512: OPERATION TIMING
VCC: POWER SUPPLY VOLTAGE, POWER SUPPLY VOLTAGE TERMINAL
GND: GROUND VOLTAGE, GROUND TERMINAL
VT: REFERENCE VOLTAGE FOR DETERMINING TYPE OF SWITCH CIRCUIT

What is claimed is:

1. A switch circuit comprising:
a switch element that is provided between an input terminal and an output terminal; and
a switch driving unit that drives the switch element on the basis of a control signal for instructing turn-on and turn-off of the switch element, wherein
the switch driving unit is driven between a first power supply voltage and a second power supply voltage that are different from each other,
an input voltage is supplied to the input terminal,
the input voltage is different from the first power supply voltage and the second power supply voltage, and
the switch driving unit includes
a source follower circuit having a drain side being connected to a first power supply terminal side that is supplied with the first power supply voltage, inputting a voltage based on the input voltage, and supplying a voltage generated in an output side to the switch element as a driving voltage for driving the switch element, and
a current control unit that opens and closes a current path between the output side of the source follower circuit and a second power supply terminal supplied with the second power supply voltage, in response to the control signal.

2. The switch circuit according to claim 1, wherein
the switch element includes
a first conductive type first MOS transistor having a drain terminal being connected to the input terminal side and a gate terminal being supplied with the driving voltage, and
a first conductive type second MOS transistor having a drain terminal being connected to the output terminal side, a gate terminal being connected to a gate terminal side of the first MOS transistor, and a source terminal being connected in common with a source terminal of the first MOS transistor,
the source follower circuit includes
a second conductive type third MOS transistor having a drain terminal being connected to the first power supply terminal side and a gate terminal being connected to source terminal sides of the first MOS transistor and the second MOS transistor, and
a voltage generation unit having one end being connected to a source terminal side of the third MOS transistor and the other end being connected to the gate terminal sides of the first MOS transistor and the second MOS transistor, and generating voltages in both ends based on a current to be supplied, and the current control unit opens a current path between the other end of the voltage generation unit and the second power supply terminal when the control signal instructs turn-on of the switch element, and closes the current path when the control signal instructs turn-off of the switch element.

3. The switch circuit according to claim 2, wherein the switch driving unit further includes an off acceleration unit for forming a current path through which a current, which is smaller than a current flowing through a current path formed by the current control unit, flows, between the first power supply terminal and the source terminals of the first MOS transistor and the second MOS transistor, through the other end of the voltage generation unit and the gate terminals of the first MOS transistor and the second MOS transistor.

4. The switch circuit according to claim 2, wherein the switch driving unit further includes an off acceleration unit that forms a current path through the other end of the voltage generation unit between the first power supply terminal and the source terminals of the first MOS transistor and the second MOS transistor, during a period in which the current control unit closes the current path.

5. The switch circuit according to claim 4, wherein a period in which the off acceleration unit forms the current path is a portion of the period in which the current control unit closes the current path.

6. The switch circuit according to claim 4, wherein a period in which the off acceleration unit forms the current path is a period corresponding to the period in which the current control unit closes the current path.

7. The switch circuit according to claim 3, wherein
the first power supply voltage is set to a voltage value that is equal to or greater than the input voltage, and
the first conductive type is a P-channel type, and the second conductive type is an N-channel type.

8. The switch circuit according to claim 3, wherein
the first power supply voltage is set to a ground voltage, and the second power supply voltage is set to a voltage value that is equal to or greater than the input voltage, and
the first conductive type is an N-channel type, and the second conductive type is a P-channel type.

9. A selection circuit that, when each block, which is constituted by one or a plurality of unit cells among a plurality of unit cells constituting an assembled battery by one ends and the other ends of the unit cells being connected to each other, is assumed to be one unit, selects signal lines connected to both ends of any of the blocks and connects the selected signal lines to a first output terminal and a second output terminal, in response to a control signal to be input, the selection circuit comprising, with respect to each of the blocks:

a first switch circuit that includes an input terminal being connected to the signal line that is connected to one end of the block and an output terminal being connected to the signal line that is connected to the first output terminal, and electrically connects the input terminal and the output terminal to each other in response to the control signal; and a second switch circuit that includes an input terminal being connected to the signal line that is connected to the other end of the block and an output terminal being connected to the signal line that is connected to the second output terminal, and electrically connects the input terminal and the output terminal in response to the control signal, wherein the first switch circuit and the second switch circuit each include
a switch element that is provided between the input terminal and the output terminal of the switch circuit, and
a switch driving unit that drives the switch element in response to the control signal,
the switch driving unit is driven between a first power supply voltage and a second power supply voltage that are different from each other,
an input voltage is supplied to the input terminal,
the input voltage is different from the first power supply voltage and the second power supply voltage, and
the switch driving unit includes
a source follower circuit that is disposed between a first power supply terminal being supplied with the first power supply voltage and a second power supply terminal being supplied with the second power supply voltage, inputs a voltage based on the input voltage, and supplies a voltage generated in the output side to the switch element as a driving voltage for driving the switch element, and
a current control unit that opens and closes a current path in which the source follower circuit between the first power supply terminal and the second power supply terminal is disposed, in response to the control signal.

10. The selection circuit according to claim 9, wherein the first power supply voltage is a voltage based on a voltage of one end of the highest level of unit cell among the unit cells constituting the assembled battery.

11. The selection circuit according to claim 10, wherein
the switch element includes a P-type MOS transistor or an N-type MOS transistor which have a gate terminal being controlled by the driving voltage, and
the types of transistors of the switch elements of the first switch circuit and the second switch circuit which correspond to the block are made the same as each other.

12. The selection circuit according to claim 11, wherein
switch elements of the first switch circuit and the second switch circuit which correspond to a first block having a potential of the other end being equal to or greater than a predetermined potential, among the blocks, are P-type MOS transistors, and
switch elements of the first switch circuit and the second switch circuit which correspond to a second block having a potential of the other end being less than the predetermined potential, among the blocks, are N-type MOS transistors.

13. The selection circuit according to claim 12, wherein
in the first switch circuit and the second switch circuit which correspond to the first block, the switch element includes
a P-type first MOS transistor having a drain terminal being connected to the input terminal side and a gate terminal being supplied with the driving voltage, and
a P-type second MOS transistor having a drain terminal being connected to the output terminal side, a gate terminal being connected to a gate terminal side of the first MOS transistor, and a source terminal being connected in common with a source terminal of the first MOS transistor, the source follower circuit includes
an N-type third MOS transistor having a drain terminal being connected to the first power supply terminal side and a gate terminal being connected to source terminal sides of the first MOS transistor and the second MOS transistor, and
a voltage generation unit having one end being connected to a source terminal side of the third MOS transistor and the other end being connected to gate terminal sides of the first MOS transistor and the second MOS transistor, and generating a voltage in both ends based on a current to be supplied, and
the current control unit opens a current path between the other end of the voltage generation unit and the second power supply terminal when the control signal instructs turn-on of the switch element, and closes the current path when the control signal instructs turn-off of the switch element.

14. The selection circuit according to claim 13, wherein in the first switch circuit and the second switch circuit which correspond to the second block, the switch element includes
an N-type fourth MOS transistor having a drain terminal being connected to the input terminal side and a gate terminal being supplied with the driving voltage, and
an N-type fifth MOS transistor having a drain terminal being connected to the output terminal side, a gate terminal being connected to a gate terminal side of the fourth MOS transistor, and a source terminal being connected in common with a source terminal of the fourth MOS transistor,
the source follower circuit includes
a P-type sixth MOS transistor having a drain terminal being connected to the second power supply terminal side and a gate terminal being connected to source terminal sides of the fourth MOS transistor and the fifth MOS transistor, and
a voltage generation unit having one end being connected to a source terminal side of the sixth MOS transistor and the other end being connected to gate terminal sides of the fourth MOS transistor and the fifth MOS transistor, and generating a voltage in both ends based on a current to be supplied, and
the current control unit opens-a current path between the other end of the voltage generation unit and the first power supply terminal when the control signal instructs turn-on of the switch element, and closes the current path when the control signal instructs turn-off of the switch element.

15. The selection circuit according to claim 14, wherein in the first switch circuit and the second switch circuit which correspond to the first block, the switch driving unit further includes an off acceleration unit that forms a current path through which a current, which is smaller than a current flowing through a current path formed by the current control unit, flows, between the first power supply terminal and the source terminals of the first MOS transistor and the second MOS transistor through the other end of the voltage generation unit.

16. The selection circuit according to claim 14, wherein in the first switch circuit and the second switch circuit which correspond to the first block, the switch driving unit further includes an off acceleration unit that forms a current path through the other end of the voltage generation unit between the first power supply terminal and the source terminals of the first MOS transistor and the second MOS transistor, during a period in which the current control unit closes the current path.

17. The selection circuit according to claim 15, wherein in the first switch circuit and the second switch circuit which correspond to the second block, the switch driving unit further includes an off acceleration unit that forms a current path through which a current, which is smaller than a current flowing through a current path formed by the current control unit, flows, between the second power supply terminal and the source terminals of the fourth MOS transistor and the fifth MOS transistor through the other end of the voltage generation unit.

18. The selection circuit according to claim 16, wherein in the first switch circuit and the second switch circuit which correspond to the second block, the switch driving unit further includes an off acceleration unit that forms a current path through the other end of the voltage generation unit between the second power supply terminal and the source terminals of the first MOS transistor and the second MOS transistor, during a period in which the current control unit closes the current path.

19. A voltage measurement device that, when each block, which is constituted by one or a plurality of unit cells among a plurality of unit cells constituting an assembled battery by one ends and the other ends of the unit cells being connected to each other, is assumed to be one unit, measures voltages of both ends of the block with respect to each block, the voltage measurement device comprising:
a selection unit that selects signal lines connected to both ends of the block with respect to each block and that connects the signal lines to a first output terminal and a second output terminal, in response to a control signal to be input; and
a measurement unit that inputs voltages of the first output terminal and the second output terminal and measures a voltage between both the terminals, wherein
the selection unit includes, with respect to each of the blocks,
a first switch circuit including an input terminal being connected to the signal line that is connected to one end of the block and an output terminal being connected to the signal line that is connected to the first output terminal, and electrically connecting the input terminal and the output terminal to each other in response to the control signal, and
a second switch circuit that includes an input terminal being connected to the signal line that is connected to the other end of the block and an output terminal being connected to the signal line that is connected to the second output terminal, and electrically connecting the input terminal and the output terminal to each other in response to the control signal,
the first switch circuit and the second switch circuit each include
a switch element that is provided between the input terminal and the output terminal of the switch circuit, and
a switch driving unit that drives the switch element in response to the control signal,
the switch driving unit is driven between a first power supply voltage and a second power supply voltage that are different from each other,
an input voltage is supplied to the input terminal,
the input voltage is different from the first power supply voltage and the second power supply voltage, and the switch driving unit includes
- a source follower circuit that is disposed between a first power supply terminal being supplied with the first power supply voltage and a second power supply terminal being supplied with the second power supply voltage, inputs a voltage based on the input voltage, and supplies a voltage generated in the output side to the switch element as a driving voltage for driving the switch element, and
- a current control unit that opens and closes a current path in which the source follower circuit between the first power supply terminal and the second power supply terminal is disposed, in response to the control signal.

20. The voltage measurement device according to claim 19, wherein the first power supply voltage is a voltage based on a voltage of one end of the highest level of unit cell among the unit cells constituting the assembled battery.

21. The voltage measurement device according to claim 20, wherein
the switch element includes a P-type MOS transistor or an N-type MOS transistor which have a gate terminal being controlled by the driving voltage, and
the types of transistors of the switch elements of the first switch circuit and the second switch circuit which correspond to the block are made the same as each other.

22. The voltage measurement device according to claim 21, wherein
switch elements of the first switch circuit and the second switch circuit which correspond to a first block having a potential of the other end being equal to or greater than a predetermined potential, among the blocks, are P-type MOS transistors, and
switch elements of the first switch circuit and the second switch circuit which correspond to a second block having a potential of the other end being less than the predetermined potential, among the blocks, are N-type MOS transistors.

23. The voltage measurement device according to claim 22, wherein
in the first switch circuit and the second switch circuit which correspond to the first block, the switch element includes
- a P-type first MOS transistor having a drain terminal being connected to the input terminal side and a gate terminal being supplied with the driving voltage, and
- a P-type second MOS transistor having a drain terminal being connected to the output terminal side, a gate terminal being connected to a gate terminal side of the first MOS transistor, and a source terminal being connected in common with a source terminal of the first MOS transistor, the source follower circuit includes
- an N-type third MOS transistor having a drain terminal being connected to the first power supply terminal side and a gate terminal being connected to source terminal sides of the first MOS transistor and the second MOS transistor, and
- a voltage generation unit having one end being connected to a source terminal side of the third MOS transistor and the other end being connected to gate terminal sides of the first MOS transistor and the second MOS transistor, and generating a voltage in both ends based on a current to be supplied, and the current control unit opens a current path between the other end of the voltage generation unit and the second power supply terminal when the control signal instructs turn-on of the switch element, and closes the current path when the control signal instructs turn-off of the switch element.

24. The voltage measurement device according to claim 23, wherein
in the first switch circuit and the second switch circuit which correspond to the second block, the switch element includes
- an N-type fourth MOS transistor having a drain terminal being connected to the input terminal side and a gate terminal being supplied with the driving voltage, and
- an N-type fifth MOS transistor having a drain terminal being connected to the output terminal side, a gate terminal being connected to a gate terminal side of the fourth MOS transistor, and a source terminal being connected in common with a source terminal of the fourth MOS transistor, the source follower circuit includes
- a P-type sixth MOS transistor having a drain terminal being connected to the second power supply terminal side and a gate terminal being connected to source terminal sides of the fourth MOS transistor and the fifth MOS transistor, and
- a voltage generation unit having one end being connected to a source terminal side of the sixth MOS transistor and the other end being connected to gate terminal sides of the fourth MOS transistor and the fifth MOS transistor, and generating a voltage in both ends based on a current to be supplied, and the current control unit opens a current path between the other end of the voltage generation unit and the first power supply terminal when the control signal instructs turn-on of the switch element, and closes the current path when the control signal instructs turn-off of the switch element.

25. The voltage measurement device according to claim 24, wherein in the first switch circuit and the second switch circuit which correspond to the first block, the switch driving unit further includes an off acceleration unit that forms a current path through which a current, which is smaller than a current flowing through a current path formed by the current control unit, flows, between the first power supply terminal and the source terminals of the first MOS transistor and the second MOS transistor through the other end of the voltage generation unit.

26. The voltage measurement device according to claim 24, wherein in the first switch circuit and the second switch circuit which correspond to the first block, the switch driving unit further includes an off acceleration unit that forms a current path through the other end of the voltage generation unit between the first power supply terminal and the source terminals of the first MOS transistor and the second MOS transistor, during a period in which the current control unit closes the current path.

27. The voltage measurement device according to claim 25, wherein in the first switch circuit and the second switch circuit which correspond to the second block, the switch driving unit further includes an off acceleration unit that forms a current path through which a current, which is smaller than a current flowing through a current path formed by the current control unit, flows, between the second power supply terminal and the source terminals of the fourth MOS transistor and the fifth MOS transistor through the other end of the voltage generation unit.

28. The voltage measurement device according to claim 26, wherein in the first switch circuit and the second switch circuit which correspond to the second block, the switch driving unit further includes an off acceleration unit that forms a current path through the other end of the voltage generation unit between the second power supply terminal and the source terminals of the first MOS transistor and the second MOS transistor, during a period in which the current control unit closes the current path.

29. The voltage measurement device according to claim 19, wherein the measurement unit includes a delta-sigma type analog/digital converter.

30. A switch circuit comprising:
   a switch between an input terminal and an output terminal; and
   a switch driving circuit coupled between a first node to be applied with a first power supply voltage and a second node to be applied with a second power supply voltage, and configured to drive the switch element to turn on and off in response to a control signal, wherein
   the switch includes
      a first switch element having a first control terminal coupled to a third node, a first terminal coupled to input terminal, and a second terminal coupled to a fourth node, the third node having no connection with the input terminal, and
      a second switch element having a second control terminal coupled to the third node, a third terminal coupled to the fourth node, and a fourth terminal coupled to the output terminal, and
   the switch driving circuit includes:
      a source follower circuit coupled to the first node and the third and fourth nodes, and
      a current control circuit configured to open and close a current path between the source follower circuit and the second node, in response to the control signal,
   responsive to the control signal to turn on the switch element, the switch drive circuit is configured to generate a voltage difference between the third node and the forth node to turn on the first and second switch elements to connect the input terminal and the output terminal.

* * * * *